United States Patent [19]

Arai

[11] Patent Number: 4,519,127
[45] Date of Patent: May 28, 1985

[54] METHOD OF MANUFACTURING A MESFET BY CONTROLLING IMPLANTED PEAK SURFACE DOPANTS

[75] Inventor: Kazuhiro Arai, Yokohama, Japan

[73] Assignee: Tokyo Shibaura Denki Kabushiki Kaisha, Japan

[21] Appl. No.: 583,746

[22] Filed: Feb. 27, 1984

[30] Foreign Application Priority Data

Feb. 28, 1983 [JP] Japan .................. 58-32424
Feb. 28, 1983 [JP] Japan .................. 58-32425

[51] Int. Cl.$^3$ .................. H01L 21/324; H01L 21/263
[52] U.S. Cl. .................. 29/571; 29/576 B; 29/576 T; 148/1.5; 148/187; 357/65; 357/91
[58] Field of Search .................. 148/1.5, 187; 29/571, 29/576 B, 576 T; 357/91, 65

[56] References Cited

U.S. PATENT DOCUMENTS

| | | | |
|---|---|---|---|
| 3,891,468 | 6/1975 | Ito et al. | 148/1.5 |
| 4,080,721 | 3/1978 | Hung | 29/578 |
| 4,141,756 | 2/1979 | Chiang et al. | 148/1.5 |
| 4,369,072 | 1/1983 | Bakeman, Jr. et al. | 148/1.5 |
| 4,377,030 | 3/1983 | Pettenpaul et al. | 29/576 |
| 4,381,952 | 5/1983 | Rosen | 148/1.5 |
| 4,396,437 | 8/1983 | Kwok et al. | 148/1.5 |
| 4,452,646 | 1/1984 | Zuleeg | 148/1.5 |
| 4,473,939 | 10/1984 | Feng et al. | 29/571 |

FOREIGN PATENT DOCUMENTS 142877  12/1978  Japan .................. 148/1.5

OTHER PUBLICATIONS

Tung-Ho et al., in Inst. Phys. Conf. Series #28, 1976, Chapter 2, Coventry, Warwick, England, p. 96–103.
Onodera et al., Electronics Letts., vol 20, (Jan. 1984), 45–47.
Codella et al., IBM-TDB, 26 (1983) 1988.
Chang, L. L., IBM-TDB, 24 (1982) 4071.

Primary Examiner—Upendra Roy
Attorney, Agent, or Firm—Finnegan, Henderson, Farabow, Garrett & Dunner

[57] ABSTRACT

A method of manufacturing a metal semiconductor field-effect transistor (MESFET) by controlling implanted peak surface dopants, is provided which comprises the steps of selectively ion-implanting an impurity in the surface of a semi-insulating substrate made of a compound selected from the group consisting of GaAs and InP performing a first ion implantation of the impurity into a portion of the surface of the semi-insulating substrate, removing that portion of the second impurity ion injection layers which extends from its surface to a depth corresponding to the vicinity of the peak value of the impurity concentration distribution, performing a second ion implantation of the impurity at least once from the surface of the remaining second impurity ion injection layers, and annealing to activate the first and second impurity ion injection layers to form the active layer on the surface and drain regions at the surface of the semi-insulating substrate and the ends of the active layer.

32 Claims, 81 Drawing Figures

F I G. 8J
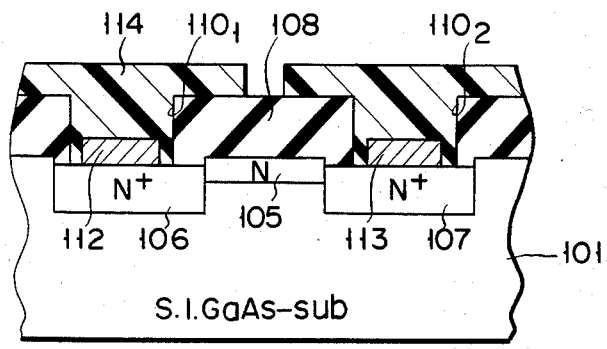
F I G. 8K
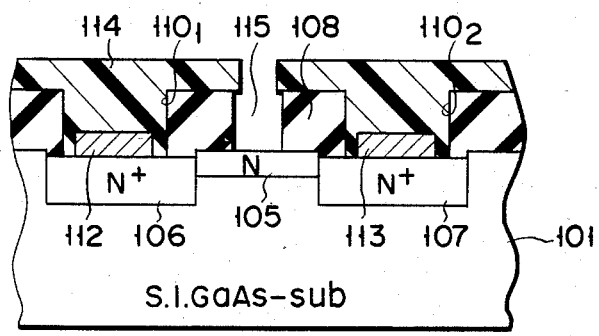
F I G. 8L
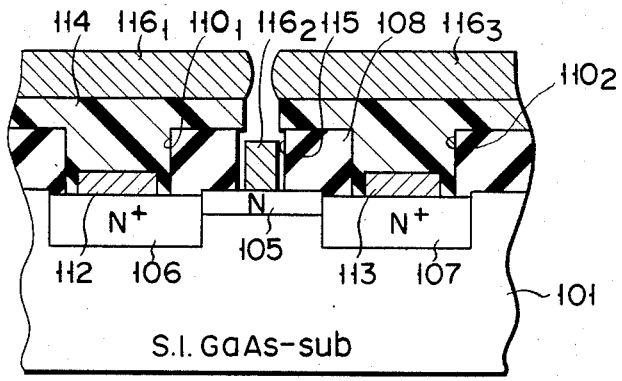
F I G. 8M
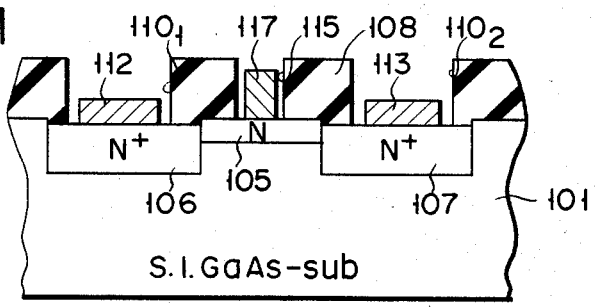

F I G. 9
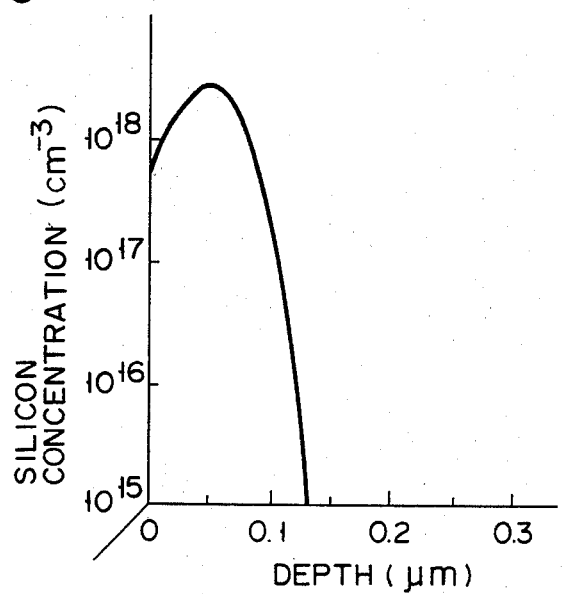
F I G. 10
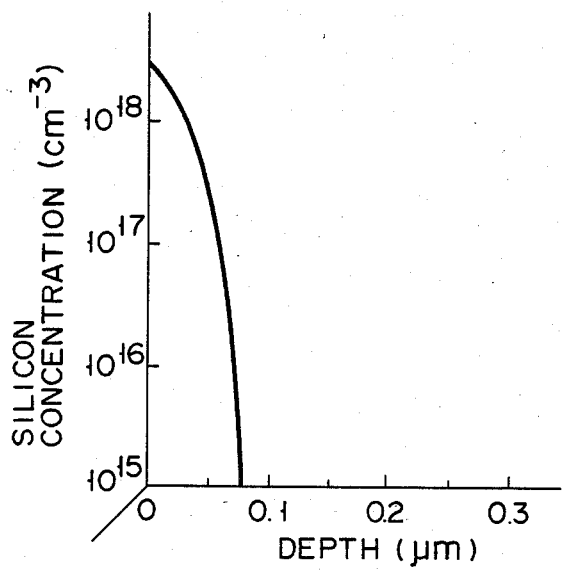

F I G. 13
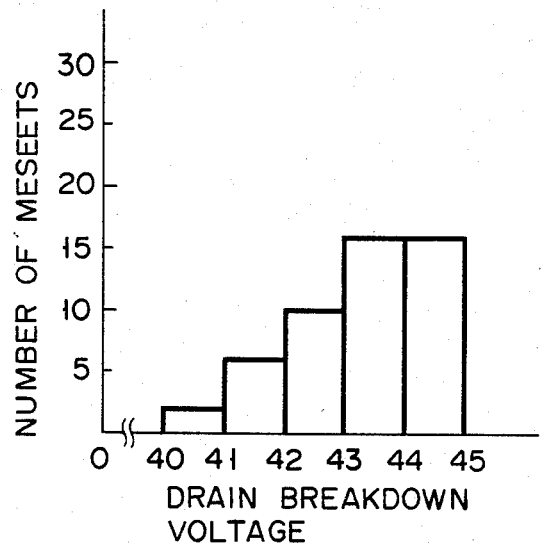
F I G. 14
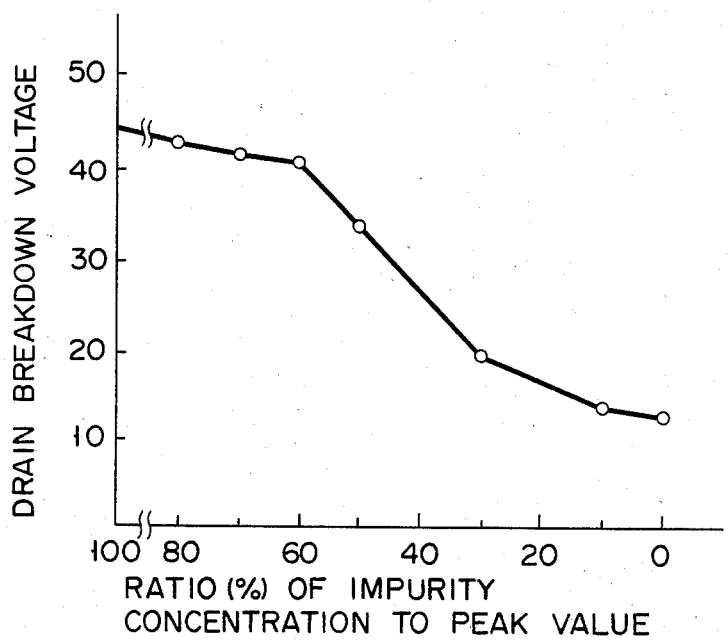

F I G. 15E
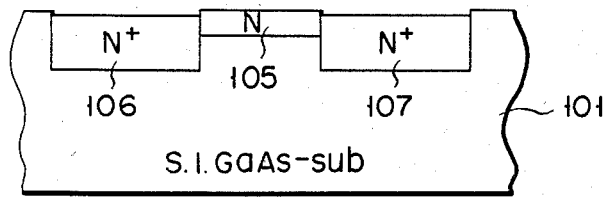
F I G. 15F
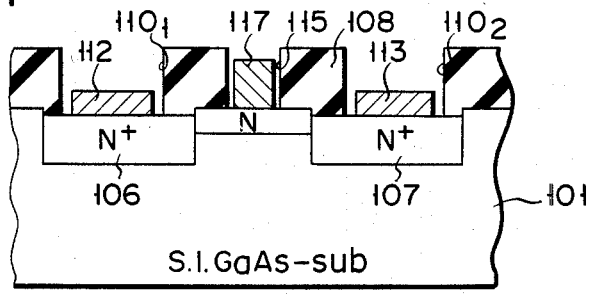
F I G. 16
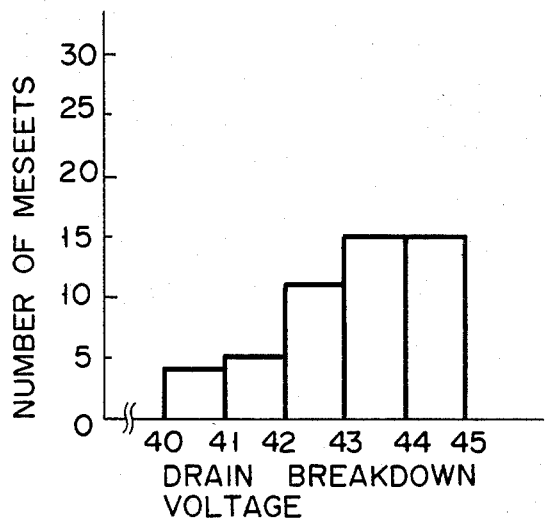

F I G. 17E
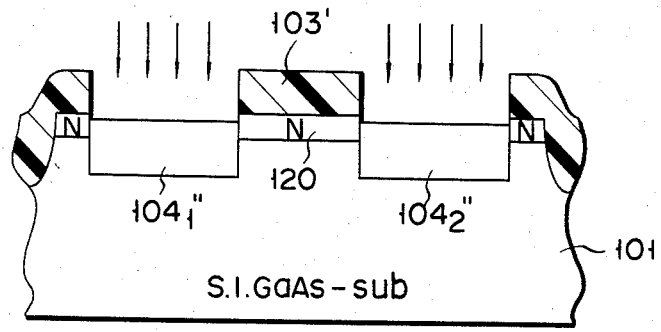
F I G. 17F
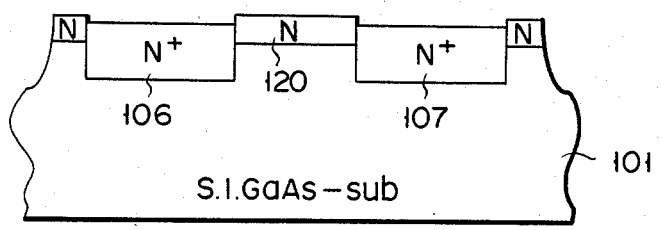
F I G. 17G
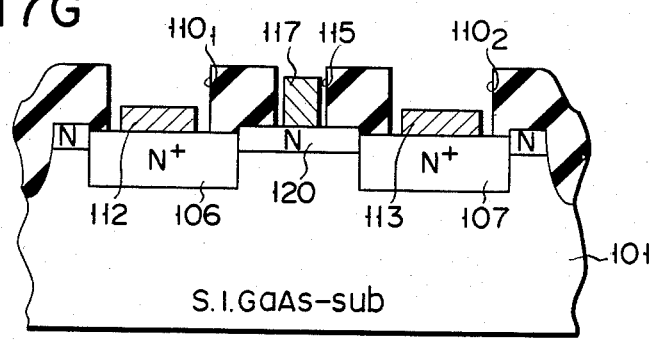

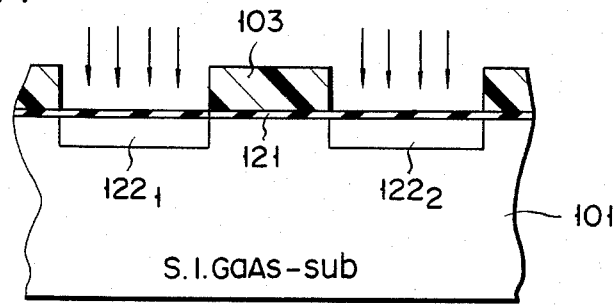
F I G. 22A
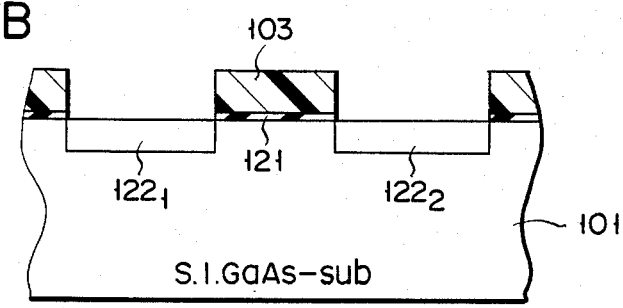
F I G. 22B
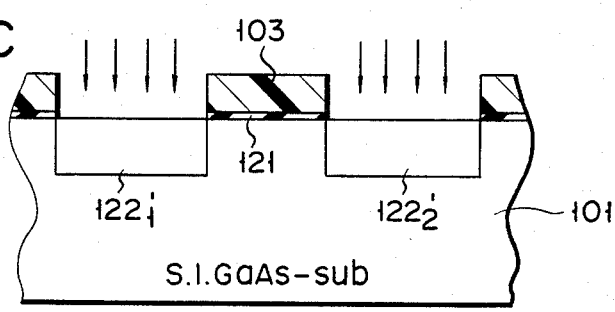
F I G. 22C
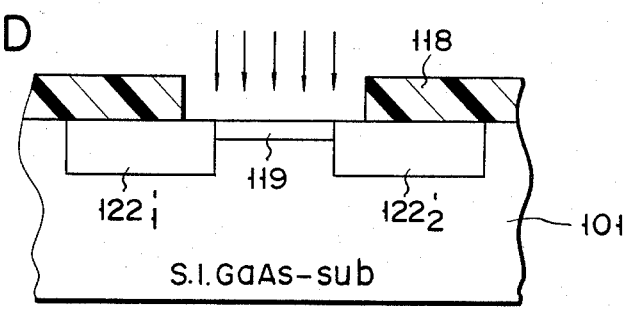
F I G. 22D F I G. 22 E
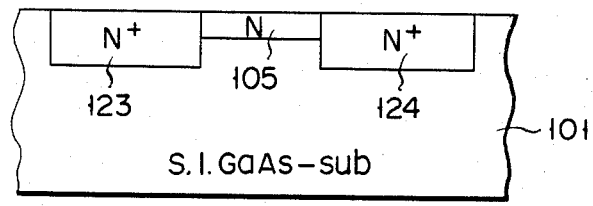
F I G. 22 F
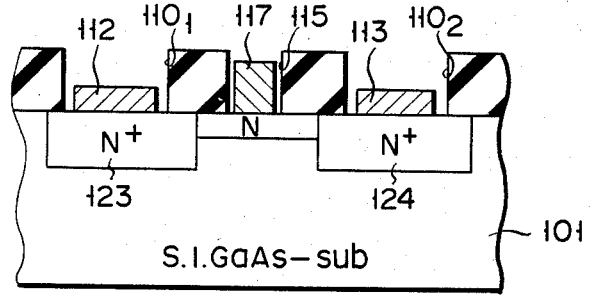
F I G. 23
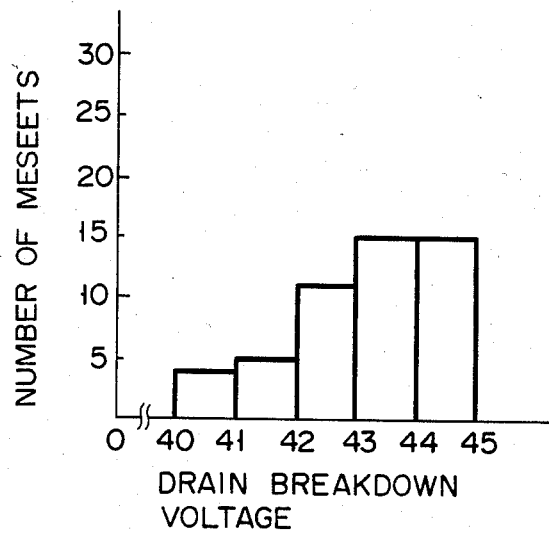

F I G. 24A
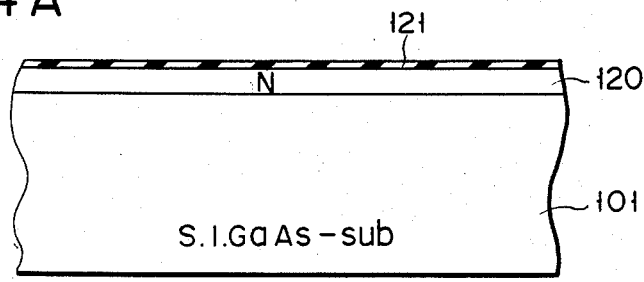
F I G. 24B
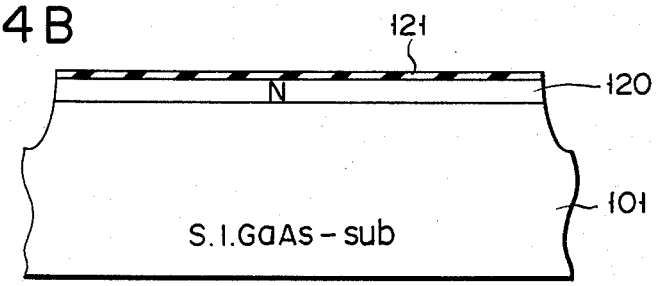
F I G. 24C
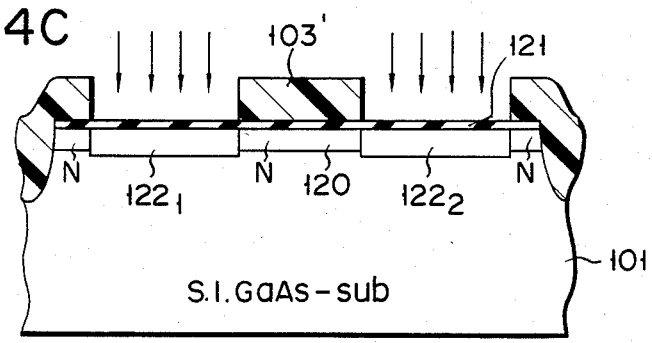
F I G. 24D
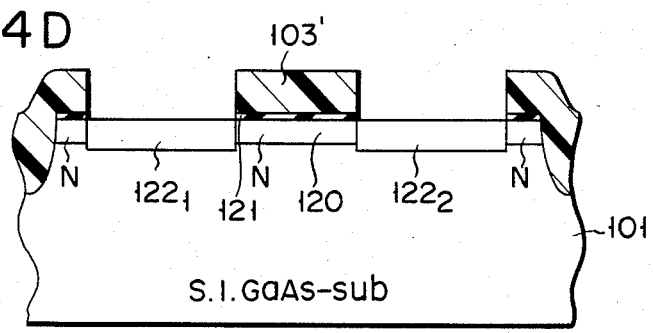

METHOD OF MANUFACTURING A MESFET BY CONTROLLING IMPLANTED PEAK SURFACE DOPANTS

BACKGROUND OF THE INVENTION

The present invention relates to a method of manufacturing a metal semiconductor field-effect transistor (MESFET) by controlling implanted peak surface dopants and, more particularly, to a method of manufacturing a MESFET having a high drain breakdown voltage by controlling implanted peak surface dopants.

Significant development has been made in FETs using compound semiconductors because of improvements in processing techniques. For example, for a MESFET using GaAs for a semi-insulating substrate, a low noise MESFET with a noise factor of 1.3 dB at a frequency of 12 GHz and a power MESFET with an output of 20 W at a frequency of 8 GHz are known. In such a MESFET, one means for improving element performance and reliability is an improvement in the main breakdown voltage. The drain breakdown voltage can be increased by rendering an ohmic contact layer (drain region) in a high-concentration layer.

The following conventional method produces a MESFET with a high drain breakdown voltage.

First, as shown in FIG. 1A, an n-type active layer 2 and an n+-type layer 3 are sequentially formed on a GaAs semi-insulating substrate 1 by epitaxial growth. The n+-type layer 3 formed in this manner has an electron concentration distribution as shown in FIG. 2. Then, as shown in FIG. 1B, mesa etching is selectively performed from the surface of the n+-type layer 3 down to the interface with the substrate 1 so as to isolate the n+-type layer 3 and the active layer 2 in an island form.

As shown in FIG. 1C, a resist pattern 4 as a lift-off material is formed by the photoengraving process (PEP) in a region including the surface of the island-shaped n+-type layer. Subsequently, as shown in FIG. 1D, an AuGe layer 5 ($5_1$ to $5_5$) and a Pt layer (not shown) are sequentially deposited on the entire surface including the resist pattern 4. During this step, the AuGe layers $5_2$ and $5_4$ and the Pt layers on the surface portion of the $n^3$-type layer 3, which is exposed through the resist pattern 4, are isolated from the AuGe layers $5_1$, $5_3$ and $5_5$ and the Pt layers on the resist pattern 4, by a step of the resist pattern 4.

As shown in FIG. 1E, the resist pattern 4 is removed to lift off the overlying AuGe layers $5_1$, $5_3$ and $5_5$, and the Pt layers, thereby forming source and drain electrodes 6 and 7 of Pt/AuGe on the surface of the n+-type layer 3. Annealing is performed at 450° C. to form ohmic contacts between the source and drain electrodes 6 and 7 and the n+-type layer 3.

Referring to FIG. 1F, after forming, by PEP, a resist pattern 8 having an opening corresponding to a prospective gate region, the n+-type layer 3 and the surface region of the active layer 2 are sequentially etched using the resist pattern 8 as a mask so as to form a recess 9. The recess 9 thus isolates: the two regions of the n+-type layer 3; an n+-type source region 10 which forms at its upper surface an ohmic contact with the source electrode 6; and an n+-type drain region 11 which forms at its upper surface an ohmic contact with the drain electrode 7.

In the next step, as shown in FIG. 1G, an aluminum film 12 ($12_1$ to $12_3$) is deposited on the entire surface of the structure including the resist pattern 8. Then, the aluminum film $12_2$ on the active layer 2 at the bottom surface of the recess 9, is isolated from the aluminum films $12_1$ and $12_3$ on the resist pattern 8, by the step between the resist pattern 8 and the recess 9. Finally, as shown in FIG. 1H the resist pattern 8 is removed to lift off the overlying aluminum films $12_1$ and $12_3$, and a gate electrode 13 of aluminum is formed on the active layer 2 to complete the MESFET.

The drain breakdown voltages of fifty MESFETs manufactured by the above-mentioned method were examined. As a result, a voltage distribution graph falling within the range of 40 to 45 V was obtained as shown in FIG. 3, indicating good drain breakdown voltage characteristics. The drain breakdown voltage was measured with measuring equipment as shown in FIG. 4. Measurements were made under the following conditions. While a negative bias was applied from a DC power source 22 to the gate electrode of a MESFET 21 through a resistor 23, a positive pulse from a pulse generator 24 with a duration of 0.1 μs and a duty of 0.01% was applied to the drain electrode. The breakdown voltage of the MESFET was measured with an oscilloscope 25 connected to the drain electrode. The source electrode of the MESFET was grounded during the measurement.

The conventional manufacturing method wherein the n+-type layer is formed by epitaxial growth has the following disadvantages. First, with an increase in the growth area of the n+-type layer, electron concentration and the resultant film thickness tend to vary. This prevents the easy manufacture of MESFETs having a uniform performance. Second, materials such as gallium, arsenic trichloride ($AsCl_3$) and the like are costly. Third, the availability of the epitaxial growth equipment limits the number of substrates on which n+-type layers can be formed within a single step, thus preventing effective mass production.

In view of this, a method for manufacturing a MESFET has been proposed wherein an n+-type ohmic contact layer (source, drain regions) is formed by ion implantation. This method will now be described with reference to FIGS. 5A to 5L.

A GaAs semi-insulating substrate 31 as shown in FIG. 5A is prepared. Then, as shown in FIG. 5B, a resist pattern 32 is formed by PEP on the major surface of the semi-insulating substrate 31. Using the resist pattern 32 as a mask, an impurity such as silicon is ion-implanted into the substrate 31 at an acceleration energy of 150 keV in a dose of $3 \times 10^{12}$ cm$^{-2}$ so as to form a silicon ion injection layer 33 for an active layer.

As shown in FIG. 5C, after the resist pattern 32 is removed, another resist pattern 34 is formed by PEP which has an opening corresponding to a prospective ohmic contact layer (source, drain regions). Using the resist pattern 34 as a mask, an impurity such as silicon is ion-implanted twice into the substrate 31 with the acceleration energies of 120 keV and 250 keV in a dose of $2 \times 10^{13}$ cm$^{-2}$. Thus, the silicon ion injection layers $35_1$ and $35_2$ for source and drain regions are formed. Subsequently, as shown in FIG. 5D, after the resist pattern 34 is removed, annealing is performed at 850° C. for 15 minutes to activate the silicon ion injection layer 33, $35_1$ and $35_2$ of the semi-insulating substrate 31. Thus, an n-type active layer 36 having a depth of 0.25 μm, and n+-type source and drain regions 37 and 38 having a depth of 0.4 μm are formed. The source and drain regions 37 and 38 formed in this manner have the electron concentration distribution as shown in FIG. 6.

Then, as shown in FIG. 5E, after depositing an SiO$_2$ film 39 of 5,000 Å thickness on the major surface of the semi-insulating substrate 31 by the plasma CVD (Chemical Vapor Deposition) method, a resist pattern 40 is formed by PEP which has openings corresponding to parts of the source and drain regions 37 and 38. Subsequently, as shown in FIG. 5F, using the resist pattern 40 as a mask, the SiO$_2$ film 39 is selectively etched by, for example, dilute hydrofluoric acid to form openings 41$_1$ and 41$_2$. In this etching step, the SiO$_2$ film 39 is overetched and the resist pattern 40 is overhung.

In the next step shown in FIG. 5G, an AuGe layer 42 (42$_1$ to 42$_5$) and a Pt layer (not shown) are sequentially deposited on the entire surface including the resist pattern 40. The AuGe layers 42$_2$ and 42$_4$ and the Pt layers on the surfaces of the source and drain regions 37 and 38 in the openings 41$_1$ and 41$_2$, which are exposed through the resist pattern 40, are isolated from the AuGe layers 42$_1$, 42$_3$ and 42$_5$ and the Pt layers on the resist pattern 40, by the step of the resist pattern 40 and the SiO$_2$ film 39. The resist pattern 40 over hangs the openings 41$_1$, 41$_2$ of the SiO$_2$ film 39. Therefore, the sides of the AuGe layers 42$_2$, 42$_4$ and Pt layers are at the distance corresponding to the length of the overhang from the surfaces of the openings 41$_1$, 41$_2$. Subsequently, as shown in FIG. 5H, the resist pattern 40 is removed to lift off the overlying AuGe layers 42$_1$, 42$_3$ and 42$_5$ and the Pt layers, to form source and drain electrodes 43 and 44 of Pt/AuGe on most parts of the source and drain regions 37 and 38. Annealing is then performed at 450° C. to form ohmic contacts between the source and drain electrodes 43 and 44, and the surfaces of the n$^+$-type source and drain regions 37 and 38, respectively.

As shown in FIG. 5I, a resist pattern 45 is formed by PEP which has an opening corresponding to a prospective gate region. Referring to FIG. 5J, using the resist pattern 45 as a mask, the SiO$_2$ film 39 is selectively etched with, for example, dilute hydrofluoric acid to form a recess 46. During this etching step, the SiO$_2$ film 39 is overetched and the resist pattern 45 is overhung.

Referring to FIG. 5k, an aluminum film 47 (47$_1$ to 47$_3$) of, for example, 4,000 Å thickness is formed on the entire surface including the resist pattern 45. The aluminum film 47$_2$ on the surface of the active layer 36 at the bottom surface of the recess 46, which is exposed through the resist pattern 45, is isolated from the aluminum films 47$_1$ and 47$_3$ on the resist pattern 45, by the step of the resist pattern 45 and the SiO$_2$ film 39. The resist pattern 45 overhangs the recess 46 of the SiO$_2$ film 39. Hence, the side of the aluminum film 47$_2$ is at the distance corresponding to the length of the overhang from the surface of the recess 46. Finally, as shown in FIG. 5L, the resist pattern 45 is removed to lift off the overlying aluminum films 47$_1$ and 47$_3$. A gate electrode 48 of aluminum is formed on the active layer 36 to complete the MESFET.

The drain breakdown voltages of fifty MESFETs manufactured by the method adopting ion injection as described above were measured with measuring equipment similar to that shown in FIG. 4. The result, as shown in FIG. 7, was that a voltage distribution falling within a range of 25 to 30 V was obtained. This range is lower than that (40 to 45 V) of the MESFETs of FIG. 1H manufactured by epitaxial growth. This lower voltage distribution prevents practical use of the ion injection method despite its many advantages.

For the following reason, the MESFET of FIG. 5L has a low drain breakdown voltage. As may be understood by comparing the electron concentration distribution (FIG. 6) of the n$^+$-type source, drain regions of the MESFET which have been formed by ion-implantation with the electron concentration distribution (FIG. 2) of the n$^+$-type layer of the MESFET (FIG. 1H) which has been formed by epitaxial growth, the electron concentration of the surface regions of the source and drain regions is so low that the depletion layer may easily reach the drain electrode. Current may therefore concentrate in the depletion layer and then flow to the drain electrode. More specifically, when voltage is applied on the gate, source and drain electrodes to operate the MESFET, the depletion layer formed in the active layer below the gate electrode will be pulled to the drain electrode. This pull increases in proportion to the voltage applied on the surface region of the drain electrode. It follows that, if the surface region of the drain region has a high electron concentration, the drain region prevents the depletion layer from reaching the drain electrode. On the other hand, if the surface region of the drain region has a low electron concentration, the drain region fails to block the depletion layer even if a relatively low voltage is applied on the drain electrode. In this case, the depletion layer extends through the surface region of the drain region to the drain electrode and current accumulates in the drain electrode, thus breaking down the MESFET.

SUMMARY OF THE INVENTION

It is an object of the present invention to provide a method for manufacturing a highly reliable MESFET which allows formation of a high breakdown voltage drain region in a semiconductor substrate by the ion implantation method and which allows the manufacture of highly reliable MESFETs with good stability and yield.

In order to achieve the above object, there is provided according to the present invention a method of manufacturing a metal semiconductor field-effect transistor by controlling implanted peak surface dopants, comprising the steps of: performing a first ion implantation of an impurity into a portion of a semi-insulating substrate made of a compound selected from the group consisting of GaAs and INP, to form an impurity ion injection layer; removing a portion of said impurity ion injection layer which extends from a surface thereof to a depth corresponding to a vicinity of a peak value of an impurity concentration distribution thereof; and performing a second ion implantation of an impurity at least once on a surface of a remaining portion of said impurity ion injection layer to form a high-concentration impurity ion injection layer, and thereafter annealing said high-concentration impurity ion injection layer to activate and form source and drain regions.

BRIEF DESCRIPTION OF THE DRAWINGS

FIGS. 8A to 8M are cross-sectional views of a MESFET of Example 1 of the present invention in sequential steps of a manufacture method;

FIG. 9 is a graph showing the silicon concentration of a silicon injection layer for source and drain regions formed in the step shown in FIG. 8B;

FIG. 10 is a graph showing the silicon concentration of the remaining silicon injection layer obtained in the step shown in FIG. 8C;

FIG. 13 is a graph showing the number of MESFETs manufactured in Example 1 having drain breakdown voltages which fall in the respective ranges;

FIG. 14 is a graph showing the relationship between the drain breakdown voltage of the MESFET according to the invention and the ratio of the silicon concentration in the surface region of the silicon ion injection layer remaining after the first ion implantation and etching to the peak silicon concentration;

FIGS. 15A to 15F are cross-sectional views of a MESFET of Example 2 in sequential steps of a manufacture method;

FIG. 16 is a graph showing the number of MESFETs manufactured in Example 2 having a breakdown voltage which falls in the respective ranges;

FIGS. 17A to 17G are cross-sectional views of a MESFET of Example 3 in sequential steps of a manufacture method;

FIGS. 22A to 22F are cross-sectional views of a MESFET of Example 5 in sequential steps of a manufacture method;

FIG. 23 is a graph showing the number of MESFETs manufactured in Example 5 having drain breakdown voltages which fall in the respective ranges; and FIGS. 24A to 24G are cross-sectional views of a MESFET in Example 6 in sequential steps of a manufacture method.

DESCRIPTION OF THE PREFERRED EMBODIMENT

The present invention will now be described by way of examples with reference to the accompanying drawings.

EXAMPLE 1

Figure 8A:
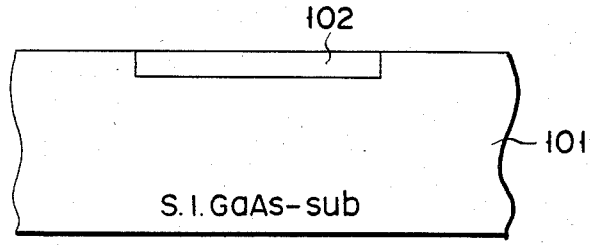

First, as shown in FIG. 8A, using a resist pattern (not shown) formed by PEP, an impurity, e.g., silicon was ion-implanted into a GaAs semi-insulating substrate 101 at an acceleration energy of 150 keV in a dose of $3 \times 10^{12}$ cm$^{-2}$ to form a silicon ion injection layer 102 for an active layer. The resist pattern was removed thereafter.

Figure 8B:
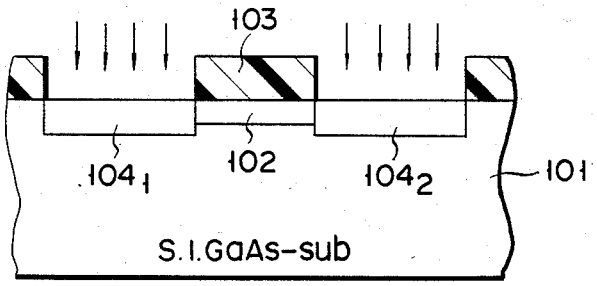

Then, as shown in FIG. 8B, a resist pattern 103 was formed by PEP to have openings corresponding to prospective source and drain regions. Using the resist pattern 103 as a mask, an impurity, e.g., silicon, was used in a first ion implantation into the semi-insulating substrate 101 at an acceleration energy of 50 keV and a dose of $1.4 \times 10^{13}$ cm$^{-2}$ so as to form the silicon ion injection layers $104_1$ and $104_2$ for the source and drain regions. The silicon ion injection layers $104_1$ and $104_2$ formed in this manner have the silicon concentration distribution as shown in FIG. 9 and have the concentration peak at a depth of 500 Å from their surfaces.

Figure 8C:
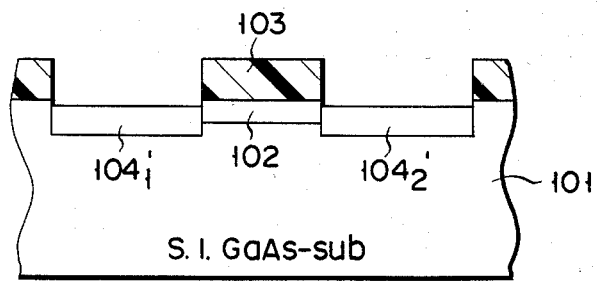

Referring to FIG. 8C, using the resist pattern 103 as a mask and an etching solution of $H_3PO_4:H_2O_2:H_2O = 1:1:1$, the silicon ion injection layers $104_1$ and $104_2$ were selectively etched from their surfaces to a depth (500 Å) corresponding to the peak silicon concentration. The remaining silicon ion injection layers $104_1$, and $104_2$, formed in this manner have the silicon concentration distribution as shown in FIG. 10, and their surfaces have the peak silicon concentration achieved by this first ion implantation.

Figure 8D:
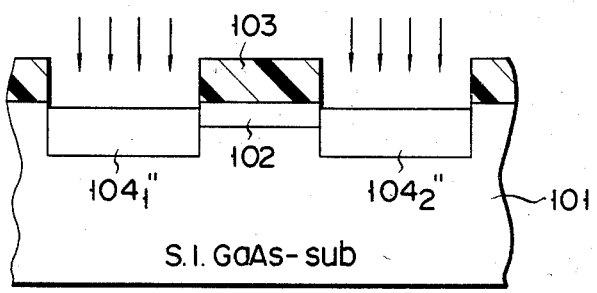
Figure 8E:
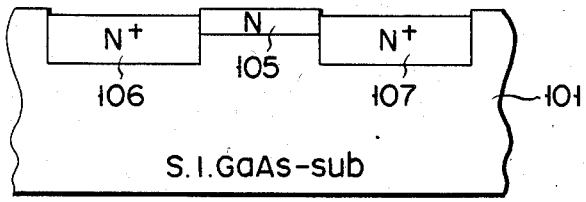
Figure 11:
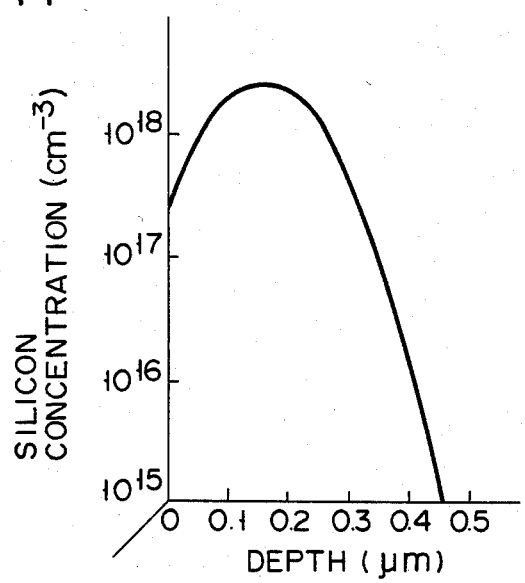
FIG. 11 is a graph showing the silicon concentration distribution of the high-concentration silicon injection layer obtained in the step shown in FIG. 8D.

Next, as shown in FIG. 8D, using the resist pattern 103 as a mask, a second ion implantations was performed twice at acceleration energies of 120 keV and 250 keV in a dose of $2 \times 10^{13}$ cm$^{-2}$ to form high-concentration silicon ion injection layers $104_1''$ and $104_2''$. The high-concentration silicon ion injection layers $104_1''$ and $104_2''$ formed in this manner have the silicon concentration distribution as shown in FIG. 11. Subsequently, after the resist pattern 103 was removed, as shown in FIG. 8E, annealing was performed at a temperature of 850° C. for 15 minutes to activate the silicon ion injection layers 102, $104_1''$ and $104_2''$ of the semi-insulating substrate 101. Thus, an n-type active layer 105 having a depth of 0.25 μm, and n+-type source and drain regions 106 and 107 having a depth of 0.4 μm were formed. The source and drain regions 106 and 107 formed in this manner have the electron concentration distribution shown in FIG. 12, and their surfaces have the peak electron concentration.

Figure 8F:
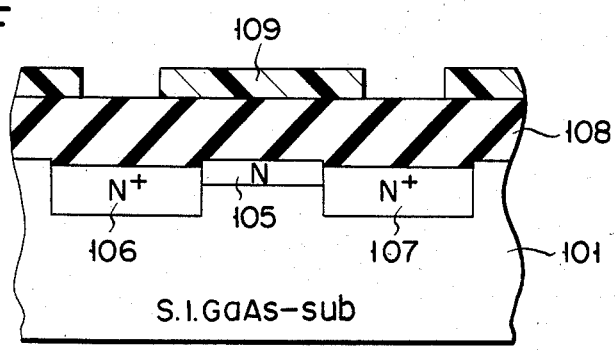
Figure 8G:
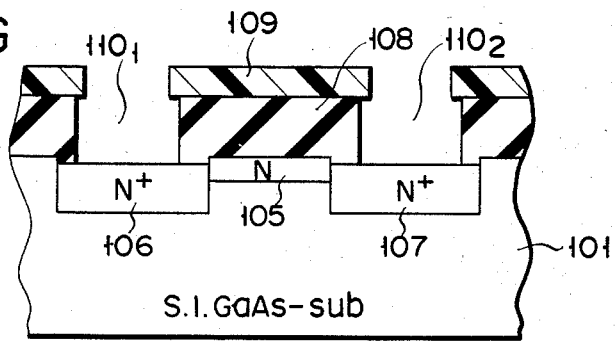

Subsequently, as shown in FIG. 8F, after depositing an SiO2 film 108 of 5,000 Å thickness on the major surface of the semi-insulating substrate 101 by the plasma CVD method, a resist pattern 109 having openings corresponding to parts of the source and drain regions 106 and 107 was formed by PEP. Then, as shown in FIG. 8G, using the resist pattern 109 as a mask, the SiO2 film 108 was selectively etched by, for example, dilute hydrofluoric acid to form openings $110_1$ and $110_2$. During this etching, the SiO$_2$ film 108 was overetched and the resist pattern 109 was overhung.

Figure 8H:
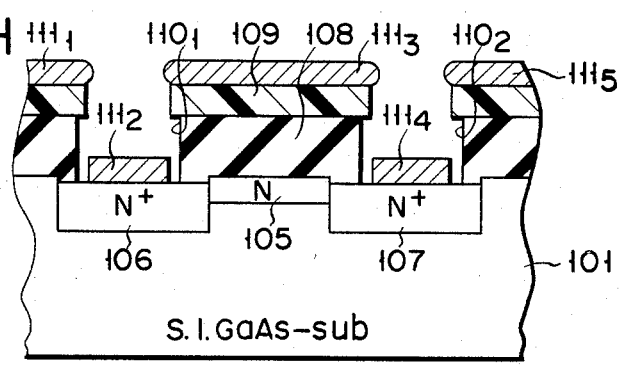
Figure 8I:
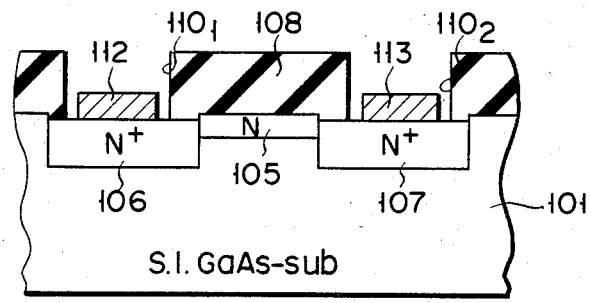

Subsequently, as shown in FIG. 8H, an AuGe layer 111 ($111_1$ to $111_5$), with a thickness of 1,500 Å, and a Pt layer were deposited on the entire surface including the resist pattern 109. In this step, the AuGe layers $111_2$ and $111_4$ and the Pt layers on the surfaces of the source and drain regions 106 and 107 in the openings $110_1$ and $110_2$ which are exposed through the resist pattern 109, were isolated from the AuGe layers $111_1$, $111_3$ and $111_5$ and the Pt layers on the resist pattern 109 by the step of the resist pattern 109 and the SiO$_2$ film 108. The resist pattern 109 overhangs the openings $110_1$, $110_2$ of the SiO$_2$ film 108. Hence, the sides of the AuGe layers $111_2$, $111_4$ and the Pt layers are at the distance corresponding to the length of the overhang from the surfaces of these openings $110_1$, $110_2$. Then, as shown in FIG. 8I, the resist pattern 109 was removed to lift off the overlying AuGe layers $111_1$, $111_3$ and $111_5$ and the Pt layers to form source and drain electrodes 112 and 113 of Pt/AuGe on most areas of the source and drain regions 106 and 107. Thereafter, annealing was performed at 450° C. to form ohmic contacts between the source and drain electrodes 112 and 113, and the surfaces of the n$^+$-type source and drain regions 106 and 107, respectively.

Next, as shown in FIG. 8J, a resist pattern 114 was formed by PEP which has an opening corresponding to the prospective gate region. Referring to FIG. 8K, using the resist pattern 114 as a mask, the SiO$_2$ film 108 was selectively etched with dilute hydrofluoric acid to form a recess 115. During this etching, the SiO$_2$ film 108 was overetched, and the resist pattern 114 was overhung.

Then, as shown in FIG. 8L, an aluminum film 116 ($116_1$ to $116_3$) of 4,000 Å thickness was formed on the entire surface including the resist pattern 114. Then, the aluminum film $116_2$ which lies on the surface of the active layer 105 and on the bottom surface of the recess 115 and which is exposed through the resist pattern 114, was isolated from the aluminum films $116_1$ and $116_3$ on the resist pattern 114 by the step of the resist pattern 114 and the SiO$_2$ film 108. Since the resist pattern 114 overhangs the recess 115 of the SiO$_2$ film 108, the sides of the aluminum film $116_2$ is at the distance corresponding to the length of the overhang from the surface of the recess 115. Finally, as shown in FIG. 8M, the resist pattern 114 was removed to lift off the overlying aluminum films $116_1$ and $116_3$, and an aluminum gate electrode 117 was formed on the active layer 105 to complete a MESFET.

According to the method of the present invention, the silicon ion injection layers $104_1$ and $104_2$ are formed by the first ion implantation of silicon into the GaAs semi-insulating substrate 101 using the resist pattern 103 as a mask. Still using the resist pattern 103 as a mask, etching is performed from the surface of the silicon ion injection layers $104_1$ and $104_2$ to a depth corresponding to the peak silicon impurity concentration level to leave silicon injection layers $104_1'$ and $104_2'$, which have an impurity (silicon) concentation distribution as shown in FIG. 10. Thereafter, using the resist pattern 103 as a mask, the second ion implantation of silicon is performed. The resist pattern 103 is removed, and annealing is performed. Then, n$^+$-type source and drain regions 106 and 107 are obtained in which the electron concentration has a peak value at the surface, as shown in FIG. 11. Hence, when voltage is applied on the gate electrode 117, source electrode 112 and drain electrode 113 to operate the MESFET, the depletion layer formed in the active layer 105 below the gate electrode 117 may be attracted to the drain electrode 113. Nonetheless, the depletion layer is blocked by the surface region of the drain region 107 and thereby prevented from being reaching the drain electrode 113, since the surface region of the drain region 107 has a high electron concentration. As a result, a local current concentration can be avoided, and the drain breakdown voltage is increased.

Figure 1A:
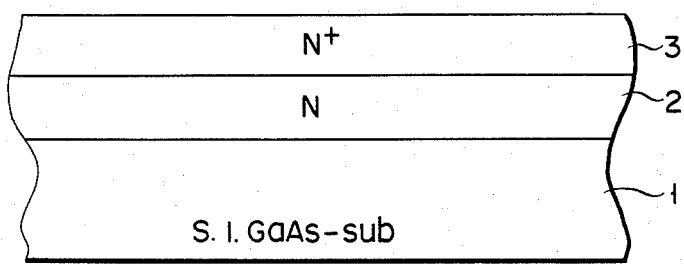
FIGS. 1A to 1H are cross-sectional views of a conventional MESFET in sequential steps of a manufacture method.
Figure 1B:
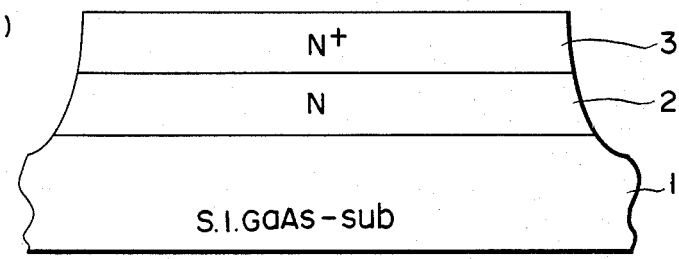
Figure 1C:
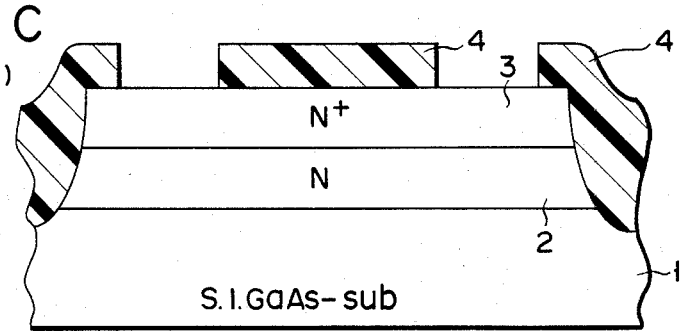
Figure 1D:
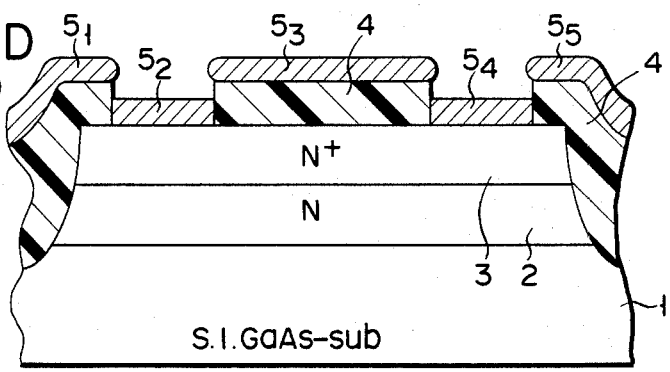
Figure 1E:
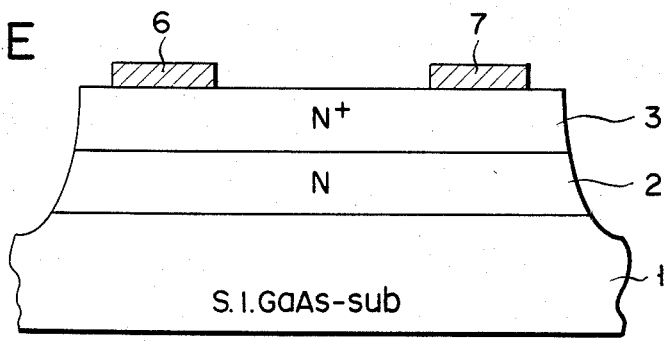
Figure 1F:
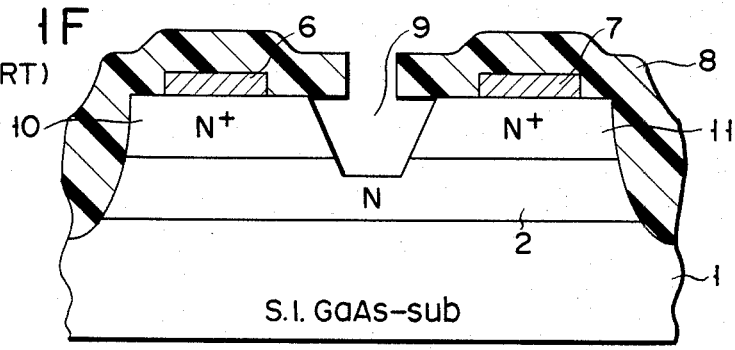
Figure 1G:
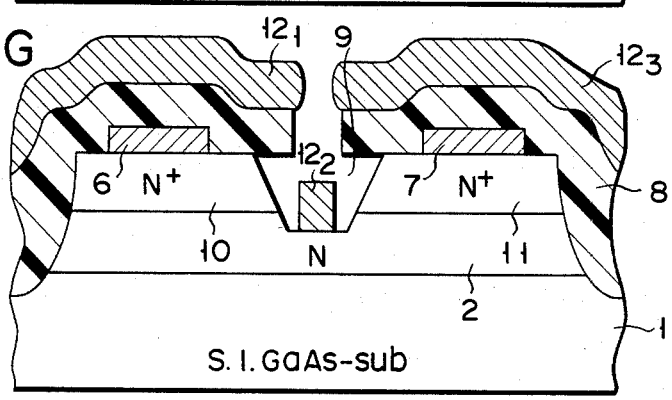
Figure 1H:
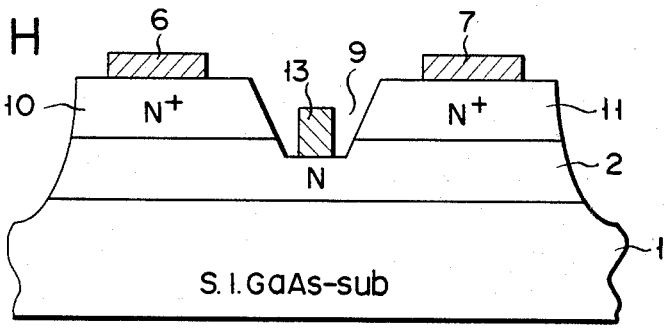
Figure 2:
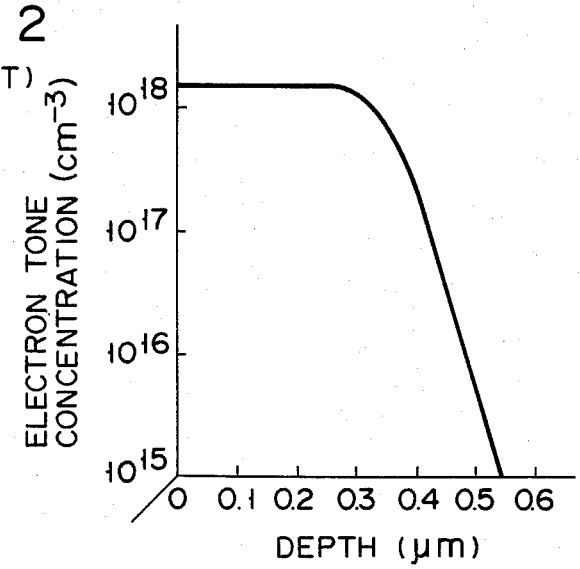
FIG. 2 is a graph of the electron concentration of an n$^+$-type layer formed in the step shown in FIG. 1A.
Figure 3:
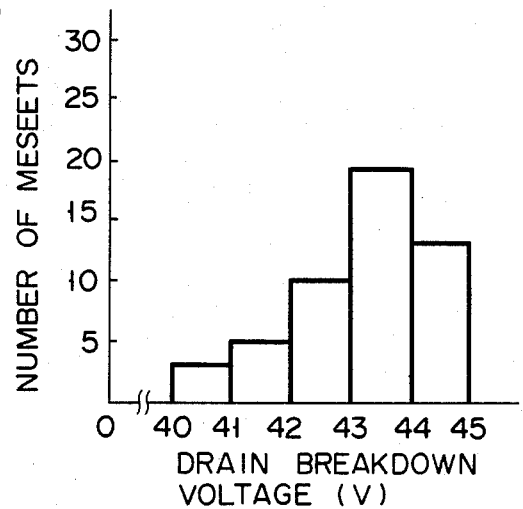
FIG. 3 is a graph showing the number of MESFETs manufactured by the steps shown in FIGS. 1A to 1H having drain breakdown voltages falling in respective ranges.
Figure 4:
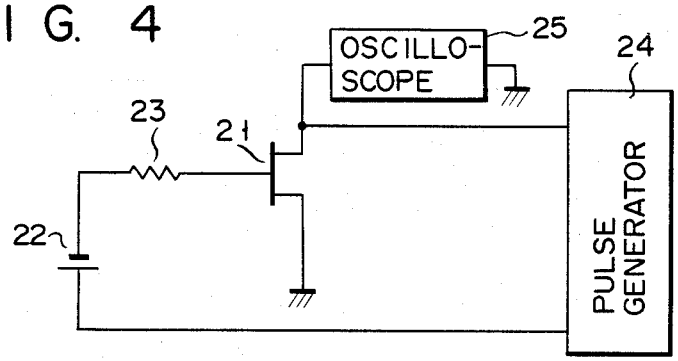
FIG. 4 is a circuit diagram of equipment for measuring the drain breakdown voltage of a MESFET.
Figure 5A:
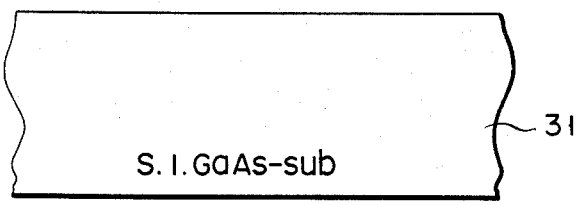
FIGS. 5A to 5L are cross-sectional views showing another conventional MESFET in sequential steps of a manufacture method.
Figure 5B:
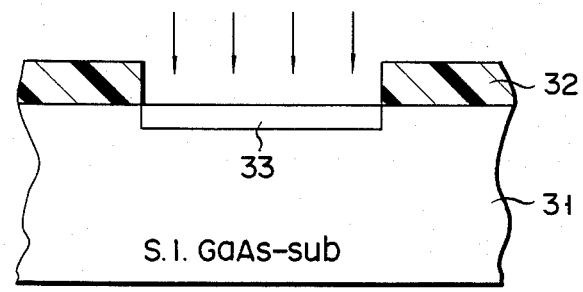
Figure 5C:
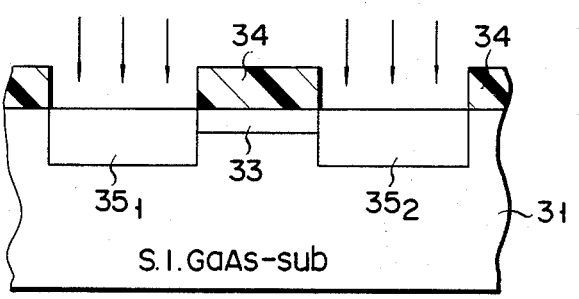
Figure 5D:
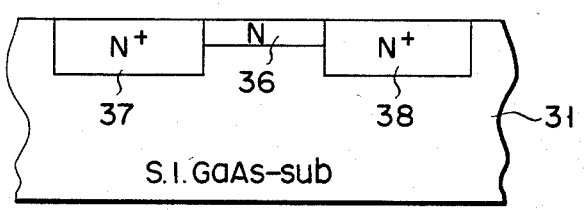
Figure 5E:
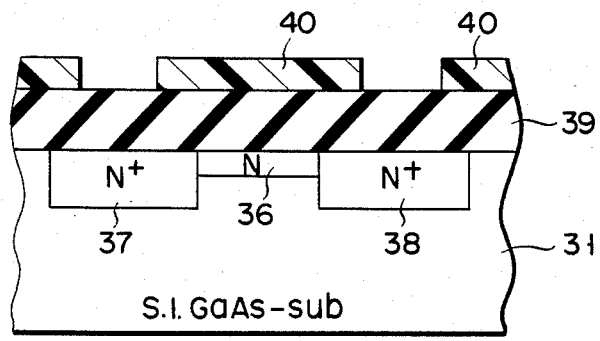
Figure 5F:
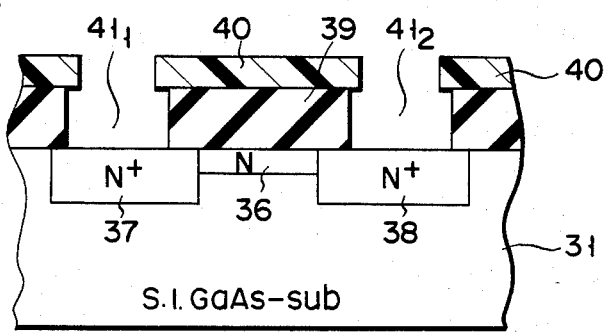
Figure 5G:
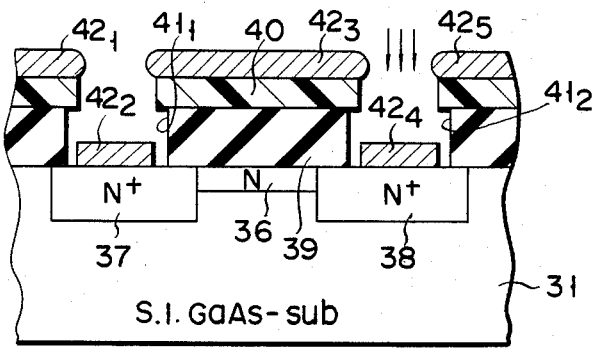
Figure 5H:
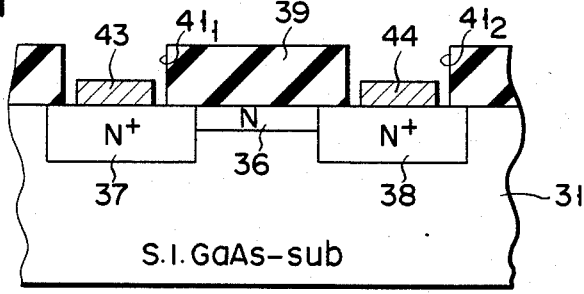
Figure 5I:
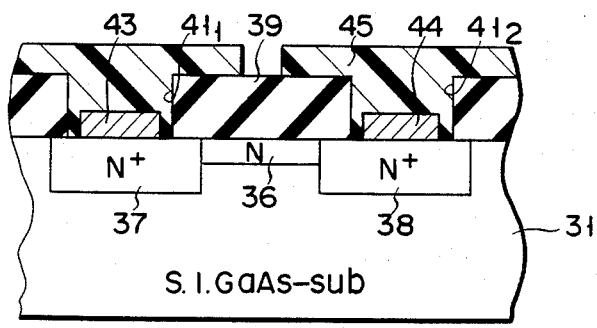
Figure 5J:
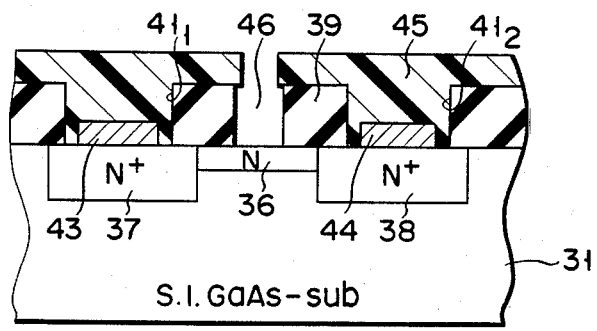
Figure 5K:
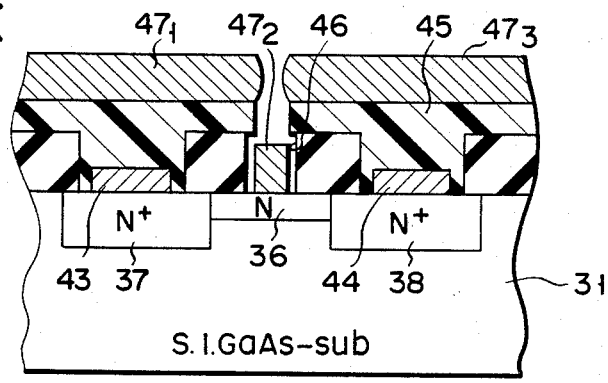
Figure 5L:
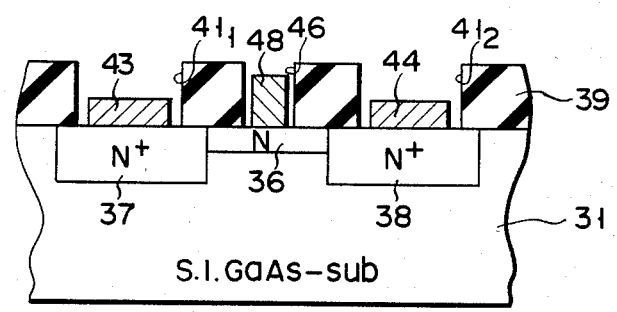
Figure 6:
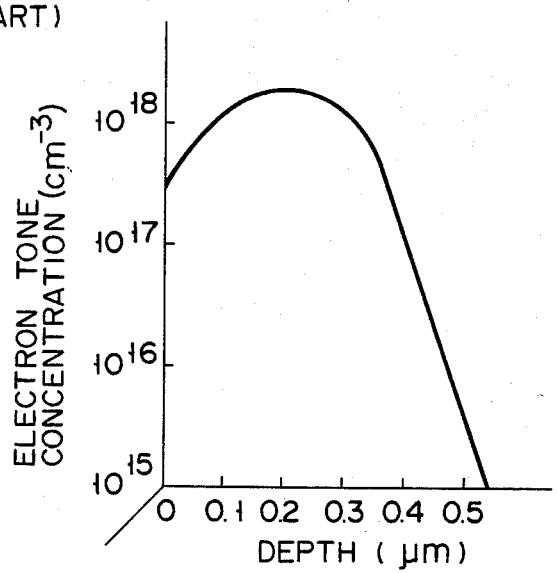
FIG. 6 is a graph of the electron concentration of n+-type source and drain regions formed in the step shown in FIG. 5D.
Figure 7:
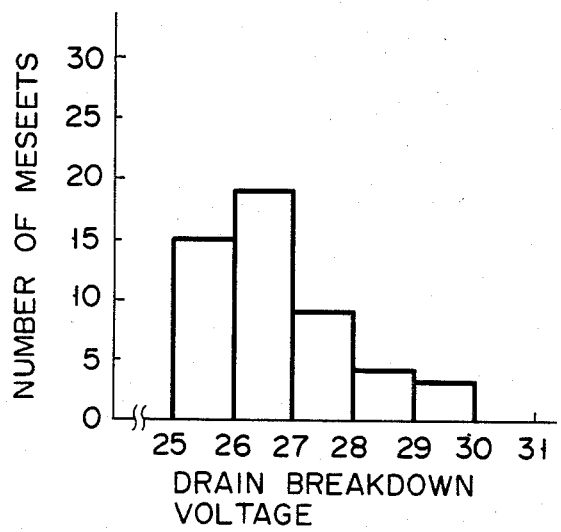
FIG. 7 is a graph showing the number of MESFETs manufactured by the steps shown in FIGS. 5A to 5L having drain breakdown voltages falling in respective ranges.

The drain breakdown voltages of fifty MESFETs prepared in Example 1 were measured with measuring equipment similar to that shown in FIG. 4. A graph showing a breakdown voltage range of 40 to 45 V as shown in FIG. 13 was prepared. It can be seen from FIG. 13 that the MESFETs have satisfactory breakdown voltages.

In a subsequent test, the etching depth was varied in the step of forming the remaining silicon ion injection layers, by etching the surfaces of the silicon ion injection layers $104_1$ and $104_2$, as shown in FIG. 8C of Example 1. The drain breakdown voltages of the obtained MESFETs were examined. The result, as shown in FIG. 14, was that when the etching depth was set equal to the depth from the surface of the silicon ion injection layers formed by the first ion implantation to the peak value (100%) of the silicon concentration distribution, a drain breakdown voltage of 45 V was obtained. When the etching depth was set equal to the depth from the surface of the silicon ion injection layers to the distribution ratio of 60% of the peak value of the silicon concentration distribution, a drain breakdown voltage of 40 V was obtained. When this ratio was less than 60%, the drain breakdown voltage decreased abruptly. Accordingly, in order to obtain a satisfactory drain breakdown voltage of a MESFET, when the silicon ion injection layers formed in a GaAs semi-insulating substrate by the first ion implantation are etched, this etching is preferably performed from the surface of these layers to a depth corresponding to 60% or more of the peak value of the silicon concentration distribution.

EXAMPLE 2

Figure 15A:
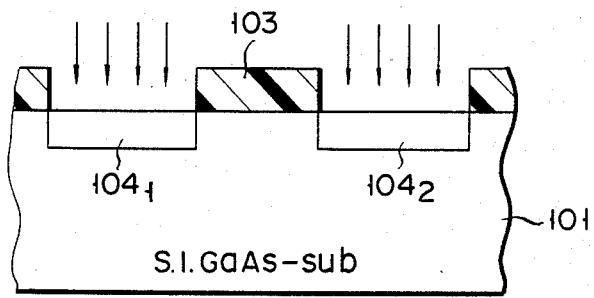

First, as shown in FIG. 15A, a resist pattern 103 was formed by PEP in a GaAs semi-insulating substrate 101 having openings corresponding to the prospective source and drain regions. Using the resist pattern 103 as a mask, an impurity, e.g., silicon, was used for the first ion implantation into the semi-insulating substrate 101 at an acceleration energy of 50 keV in a dose of $1.4 \times 10^{13}$ cm$^{-2}$, so as to form silicon ion injection layers $104_1$ and $104_2$ for the source and drain regions. The silicon ion injection layers $104_1$ and $104_2$ formed in this step have a peak silicon concentration at a depth of 500 Å from the layer surface, as shown in FIG. 9.

Figure 15B:
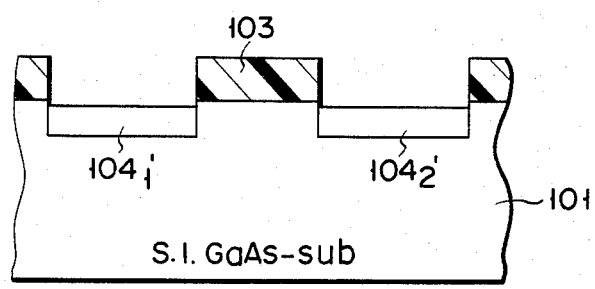

As shown in FIG. 15B, using the resist pattern 103 as a mask and an etching solution of H$_3$PO$_4$:H$_2$O$_2$:H$_2$O=1:1:1, selective etching of the silicon ion injection layers $104_1$ and $104_2$ was performed from their surfaces. Silicon ion injection layers $104_1'$ and $104_2'$ remaining after this step have the same peak concentration as obtained in the first ion implantation at their surfaces, as shown in FIG. 10.

Figure 15C:
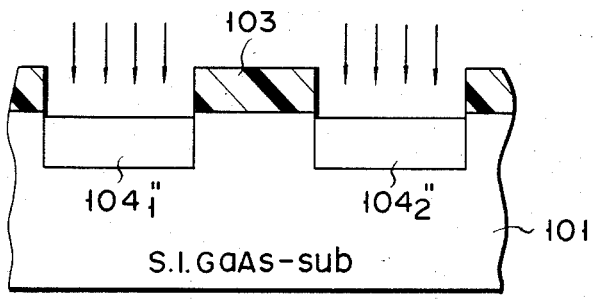

Then, as shown in FIG. 15C, using the resist pattern 103 as a mask, an impurity, e.g., silicon, was used for two second ion implantations at acceleration energies of 120 keV and 250 keV in a dose of $2\times10^{13}$ cm$^{-2}$ to form high-concentration silicon ion injection layers $104_1''$ and $104_2''$. The silicon ion injection layers $104_1''$ and $104_2''$ have the same silicon concentration distribution as shown in FIG. 11.

Figure 12:
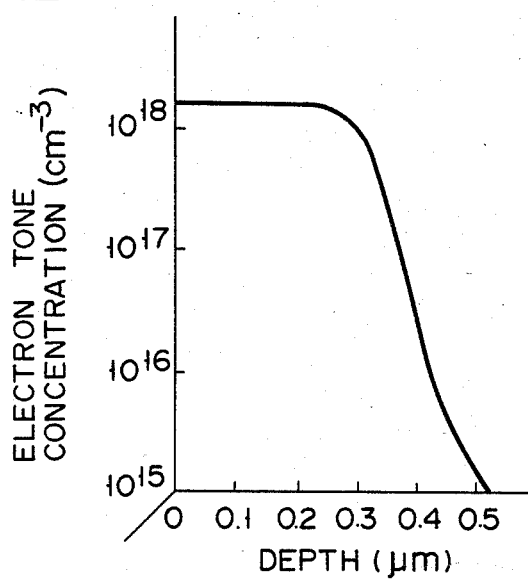
FIG. 12 is a graph showing the electron concentration distribution of n+-type source and drain regions formed in the step shown in FIG. 8E.
Figure 15D:
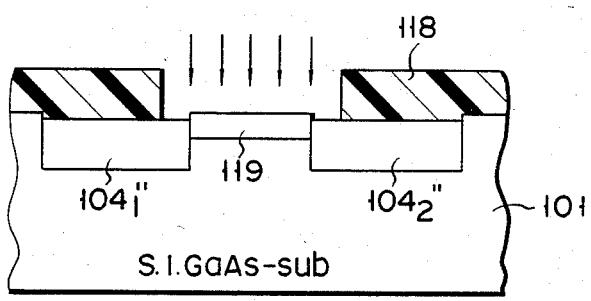

In the next step, as shown in FIG. 15D, the resist pattern 103 was removed, and another resist pattern 118 was formed by PEP. Thereafter, using the resist pattern 118 as a mask, an impurity, e.g., silicon, was ion-implanted at an acceleration energy of 150 keV in a dose of $3\times10^{12}$ cm$^{-2}$ to form a silicon ion injection layer 119 as an active layer between the silicon ion injection layers $104_1''$ and $104_2''$. Referring to FIG. 15E, after removing the resist pattern 118, annealing was performed at 850° C. for 15 minutes to activate the silicon ion injection layers $104_1''$ $104_1''$ and 119 in the semi-insulating substrate 101, to form an n-type active layer 105 having a depth of 0.25 μm, and to form n$^+$-type source and drain regions 106 and 107 having a depth of 0.4 μm. The source and drain regions 106 and 107 formed in this step have a peak electron concentration at their surfaces, as shown in FIG. 12.

Subsequently, steps similar to those shown in FIGS. 8F to 8M of Example 1 were performed to complete a MESFET as shown in FIG. 15F.

The drain breakdown voltages of fifty MESFETs prepared in Example 2 were measured with measuring equipment similar to that shown in FIG. 4. The obtained results revealed that the MESFETs had the satisfactory drain breakdown voltage range of 40 to 45 V, as shown in FIG. 16.

EXAMPLE 3

Figure 17A:
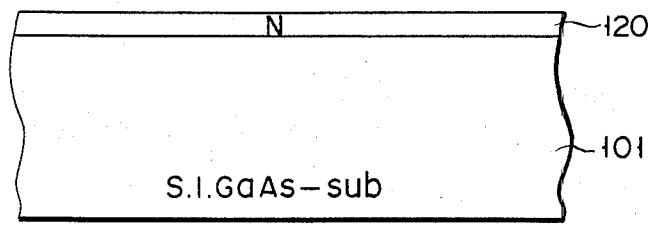
Figure 17B:
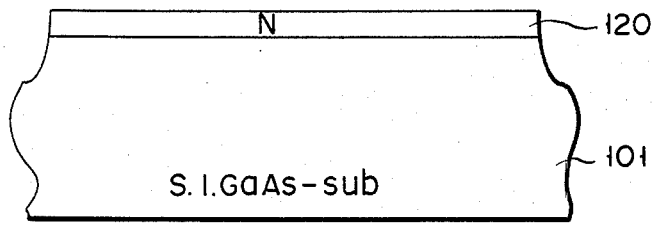

First, as shown in FIG. 17A, an n-type active layer 120 having a thickness of 0.25 μm was formed on the surface of a GaAs semi-insulating substrate 101 by the epitaxial growth. Then, as shown in FIG. 17B, mesa etching was performed from the surface of the n-type active layer 120 to a depth near the surface of the substrate 101 so as to isolate the active layer 120 in an island form.

Figure 17C:
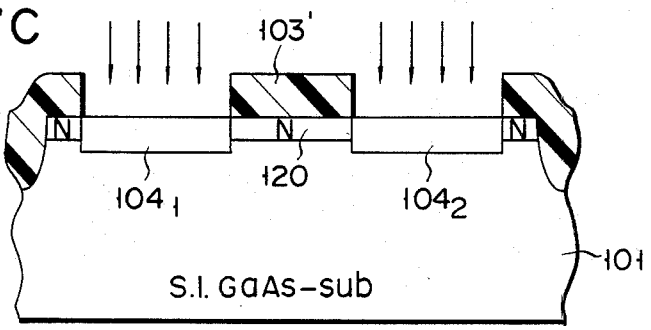

Referring to FIG. 17C, a resist pattern 103' having openings corresponding to the prospective source and drain regions was formed. Using the pattern 103' as a mask, an impurity, e.g., silicon, was used for the first ion implantation at an acceleration energy of 50 keV in a dose of $1.4\times10^{13}$ cm$^{-2}$ to form silicon ion injection layers $104_1$ and $104_2$ for source and drain regions in the regions extending from the active layer 120 to positions near the surface of the substrate 101. The silicon ion injection layers $104_1$ and $104_2$ formed in this step have the silicon concentration peak at a depth of 500 Å from the surface, as in the case of FIG. 9.

Figure 17D:
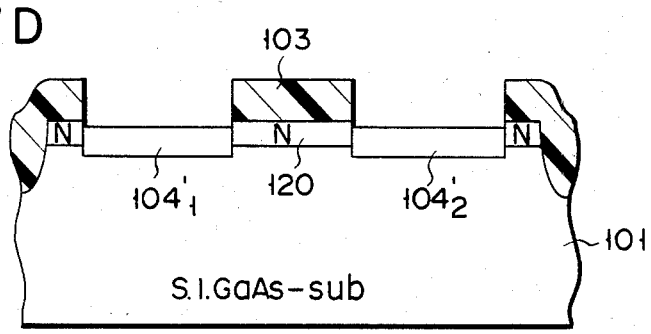

Next, as shown in FIG. 17D, using the resist pattern 103' as a mask and an etching solution of H$_3$PO$_4$:H$_2$O$_2$:H$_2$O = 1:1:1, the silicon ion injection layers $104_1$ and $104_2$ were selectively etched from the surfaces to a depth of 500 Å. Silicon ion injection layers $104_1'$ and $104_2'$ remaining after this step have a peak concentration from the first ion implantation at their surfaces, as in the case of FIG. 10.

Then, as shown in FIG. 17E, using the resist pattern 103' as a mask, an impurity, e.g., silicon, was used for two second ion implantations at acceleration energies of 120 keV and 250 keV in a dose of $2\times10^{13}$ cm$^{-2}$ to form high-concentration silicon ion injection layers $104_1''$ and $104_2''$. The silicon ion injection layers $104_1''$ and $104_2''$ have a silicon concentration distribution similar to that shown in FIG. 11. As shown in FIG. 17F, after the resist pattern 103' was removed, annealing was performed at 850° C. for 15 minutes to activate the silicon ion injection layers $104_1''$ and $104_2''$ in the substrate 101, and to form n$^+$-type source and drain regions 106 and 107 with a depth of 0.4 μm. The source and drain regions 106 and 107 formed in this manner have an electron concentration peak at their surfaces as in the case of FIG. 12.

Steps similar to those in FIGS. 8F to 8M of Example 1 were performed to manufacture a MESFET shown in FIG. 17G.

The drain breakdown voltages of fifty MESFETs manufactured as in Example 3 were measured with measuring equipment similar to that shown in FIG. 4. As in the case of Example 1, the MESFETs had a satisfactory drain breakdown voltage range of 40 to 45 V.

EXAMPLE 4

Figure 18A:
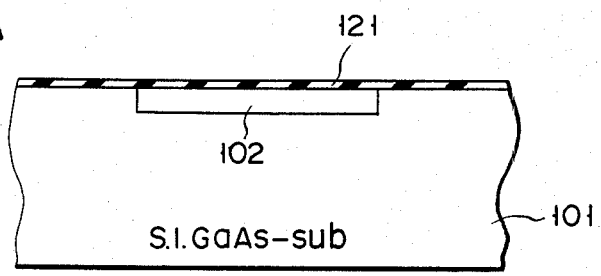
FIGS. 18A to 18F are cross-sectional views of a MESFET of Example 4 in sequential steps of a manufacture method.

First, as shown in FIG. 18A, using a resist pattern (not shown), formed in a GaAs semi-insulating substrate 101 by PEP, an impurity, e.g., silicon, was ion-implanted at an acceleration energy of 150 keV and a dose of $3\times10^{12}$ cm$^{-2}$ to form a silicon ion injection layer 102 for an active layer. After the resist pattern was removed, an SiO$_2$ film 121 of 500 Å thickness was formed on the major surface of the structure by the plasma CVD method.

Figure 18B:
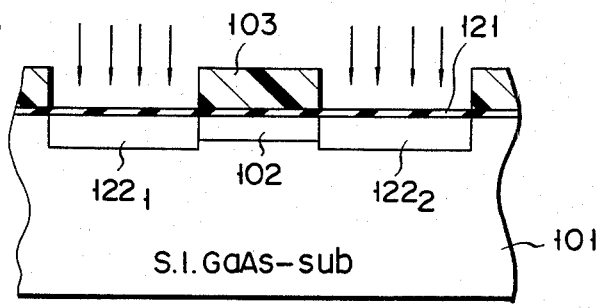
Figure 19:
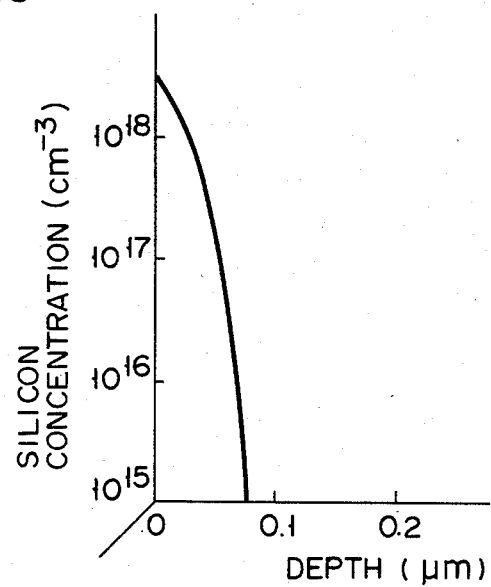
FIG. 19 is a graph showing the silicon concentration distribution of a silicon injection layer for source and drain regions formed in the step shown in FIG. 18B.

Then, as shown in FIG. 18B, another resist pattern 103 having openings corresponding to the prospective source and drain regions, was formed on the SiO$_2$ film 121 by PEP. Using the resist pattern 103 as a mask, an impurity, e.g., silicon, was used for the first ion implantation into the substrate 101 through the SiO$_2$ film 121 at an acceleration energy of 50 keV in a dose of $1.4\times10^{13}$ cm$^{-2}$ so as to form silicon ion injection layers $122_1$ and $122_2$ for the source and drain regions. In this step, the peak silicon concentration obtained by the first ion implantation of silicon was present at a depth of 500 Å from the surface. However, the range distance of the silicon in the first ion implantation can be determined by using the surface of the 500 Å thick SiO$_2$ film 121 as a reference. The peak silicon concentration is formed at the interface between the SiO$_2$ film 121 and the substrate 101. As a result, the silicon ion injection layers $122_1$ and $122_2$ have the silicon concentration distribution as shown in FIG. 19, and have their peak concentration from the first ion implantation at their surfaces.

Figure 18C:
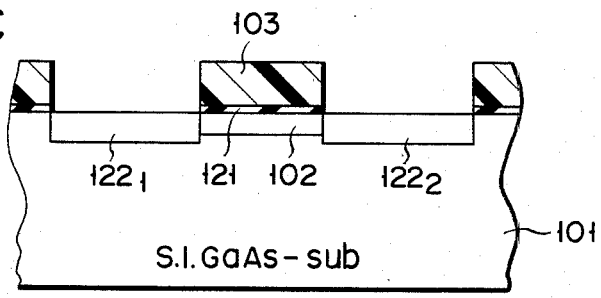
Figure 18D:
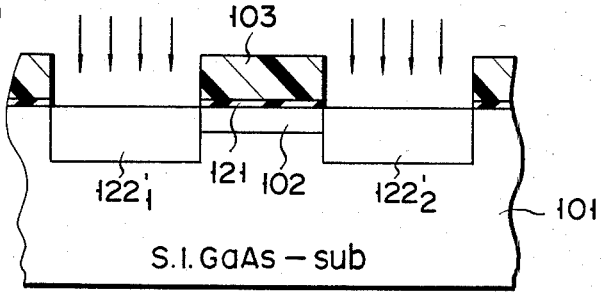

Next, as shown in FIG. 18C, using the resist pattern 103 as a mask, the SiO$_2$ film 121 was selectively etched with dilute hydrofluoric acid to expose the surfaces of the silicon ion injection layers $122_1$ and $122_2$. Then, as shown in FIG. 18D, using the resist pattern 103 as a mask, an impurity, e.g., silicon, was used for two second ion implantations at acceleration energies of 120 keV and 250 keV in a dose of $2\times10^{13}$ cm$^{-2}$ to form high-concentration silicon ion injection layers $122_1'$ and $122_2'$. The silicon ion injection layers $122_1'$ and $122_2'$ formed in this manner have the silicon concentration distribution shown in FIG. 11.

Figure 18E:
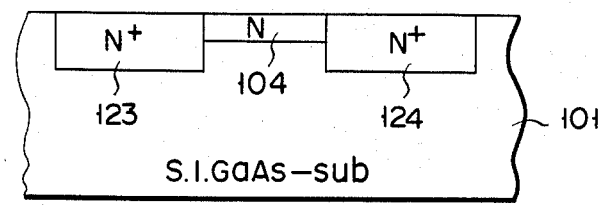

Subsequently, as shown in FIG. 18E, after the resist pattern 103 and the remaining SiO$_2$ film 121 were removed, annealing was performed at 850° C. for 15 minutes to activate the silicon ion injection layers 102, $122_1'$ and $122_2'$ to form an n-type active layer 105 with a depth of 0.25 μm, and n$^+$-type source and drain regions 123 and 124 with a depth of 0.4 μm. The source and drain regions 123 and 124 formed in this step have the electron concentration peak at their surfaces, as shown in FIG. 12.

Figure 18F:
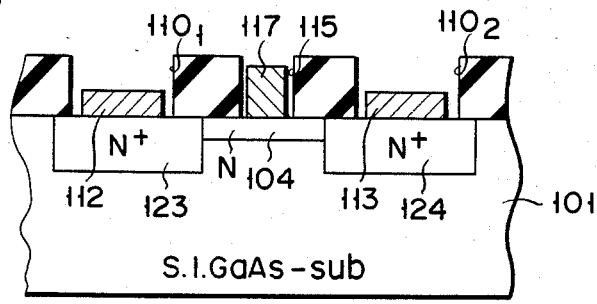

Similar steps to those in FIGS. 8F to 8M of Example 1 were used to manufacture a MESFET as shown in FIG. 18F.

According to the method of Example 4, an SiO$_2$ film 121 having a thickness of 500 Å was deposited on the GaAs semi-insulating substrate 101. After forming the resist pattern 103 on the SiO$_2$ film 121, a first ion implantation of silicon into the substrate 101 through the SiO$_2$ film 121 was performed, using the resist pattern 103 as a mask. The reference plane of the range of silicon ions was shifted upward from the surface of the substrate 101 by a distance corresponding to the thickness of the SiO$_2$ film 121, so as to form silicon ion injection layers $122_1$ and $122_2$ which have the peak silicon concentration at their surfaces, as shown in FIG. 19. Thereafter, the second ion implantation of silicon, removal of the resist pattern 103 and the SiO$_2$ film 121, and annealing were performed to give the source and drain regions 123 and 124 having a peak concentration at their surfaces, as shown in FIG. 11. Accordingly, when voltage is applied on the gate electrode 117, source electrode 112 and drain electrode 113 to operate the MESFET, the depletion layer formed in the active layer 105 below the gate electrode 117 may be attracted to the drain electrode 113. Nonetheless, the depletion layer is blocked by the surface region of the drain region 124 and thereby prevented from being reaching the drain electrode 113, since the surface region of the drain region 124 has a high electron concentration. As a result, a local current concentration is prevented, and the drain breakdown voltage of the MESFET can be improved.

Figure 20:
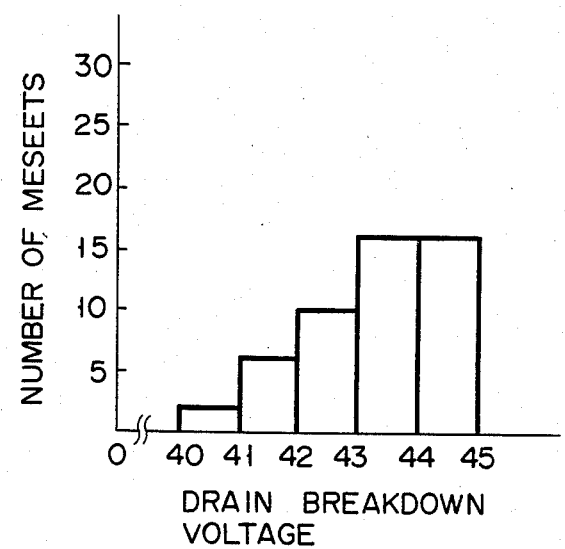
FIG. 20 is a graph showing the number of MESFETs manufactured in Example 4 having a drain breakdown voltage which falls in the respective ranges.

The drain breakdown voltages of fifty MESFETs manufactured as in Example 4 were measured with measuring equipment similar to that shown in FIG. 4. The measured drain breakdown voltages fell within the range 40 to 45 V, as shown in FIG. 20, thus confirming high drain breakdown voltages.

Figure 21:
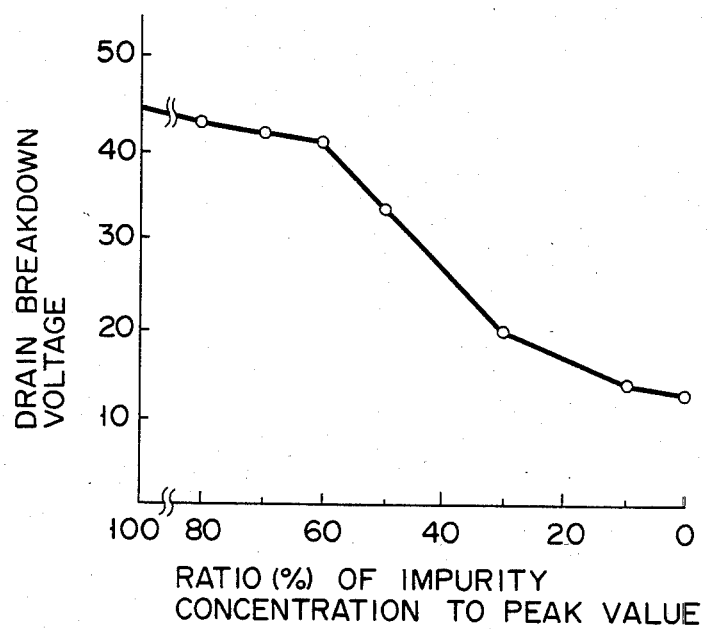
FIG. 21 is a graph illustrating the relationship between the drain breakdown voltage of the other MESFET according to the invention and the ratio of the silicon concentration in the surface region of a silicon ion injection layer formed by after the first ion implantation through a SiO2 film to the peak silicon concentration.

In the first ion implantation shown in FIG. 18B of Example 4, the thickness of the SiO$_2$ film 121 on the substrate 101 was changed and the resultant changes in the MESFET drain breakdown voltages were examined. The result, as shown in FIG. 21, was that when the thickness of the SiO$_2$ film was set such that the peak silicon concentration from the first ion implantation was present at the interface between the SiO$_2$ film and the substrate, a drain breakdown voltage of 45 V was obtained. Furthermore, when the thickness of the SiO$_2$ film was set such that 60% of the peak silicon concentration from the first ion implantation was present at the interface between the SiO$_2$ film and the substrate, a drain breakdown voltage of 40 V was obtained. When less than 60% of the peak concentration was present at this interface, the drain breakdown voltage decreased abruptly. The concentration may be kept at 60% or more at the interface between the SiO$_2$ film and the substrate by keeping the SiO$_2$ film thickness on the substrate constant, and controlling the acceleration energy of the first ion implantation. In this case, the acceleration energy is preferably 150 keV, and more preferably 30 to 80 keV. In order to obtain a satisfactory drain breakdown voltage of a MESFET, 60% or more of the peak silicon concentration from the first ion implantation is preferably present at the interface between the SiO$_2$ film and the substrate, in the step of forming the silicon ion injection layers for the source and drain regions by the first ion implantation, after the SiO$_2$ film is formed on the surface of the substrate.

EXAMPLE 5

First, as shown in FIG. 22A, an SiO$_2$ film 121 of 500 Å thickness was deposited on a GaAs semi-insulating substrate 101. A resist pattern 103 having openings corresponding to the prospective source and drain regions was formed on the SiO$_2$ film 121 by PEP. Thereafter, using the resist pattern 103 as a mask, the first ion implantation of silicon into the semi-insulating substrate 101 through the SiO$_2$ film 121 was performed at an acceleration energy of 50 keV in a dose of $1.4 \times 10^{13}$ cm$^{-2}$ so as to form silicon ion injection layers $122_1$ and $122_2$ for the source and drain regions. The silicon ion injection layers $122_1$ and $122_2$ formed in this step had the peak concentration from the first ion implantation at their surfaces, as shown in FIG. 19.

Next, as shown in FIG. 22B, using the resist pattern 103 as a mask, the SiO$_2$ film 121 was selectively etched with dilute hydrofluoric acid to expose the surfaces of the silicon ion injection layers $122_1$ and $122_2$. Then, as shown in FIG. 22C, using the resist pattern 103 as a mask, an impurity, e.g., silicon, was used for two second ion implantations at acceleration energies of 120 keV and 250 keV in a dose of $2 \times 10^{13}$ cm$^{-2}$ to form high-concentration silicon ion injection layers $122_1'$ and $122_2'$. The silicon ion injection layers $122_1'$ and $122_2'$ have a silicon concentration distribution as shown in FIG. 11.

Subsequently, as shown in FIG. 22D, the resist pattern 103 and the remaining SiO$_2$ film 121 were removed. Another resist pattern 118 was formed by PEP, and used to perform an ion implantation of an impurity, e.g., silicon, at an acceleration energy of 150 keV and a dose of $3 \times 10^{12}$ cm$^{-2}$. As a result, a silicon ion injection layer 119 for an active layer was formed between the silicon ion injection layers $122_1'$ and $122_2'$. Referring to FIG. 22E, after the resist pattern 118 was removed, annealing was performed at 850° C. for 15 minutes to activate the silicon ion injection layers 118, $122_1'$ and $122_2'$, and to form an n-type active layer 105 with a depth of 0.25 μm and n$^+$-type source and drain regions 123 and 124 with a depth of 0.4 μm. The source and drain regions 123 and 124 formed in this step have a peak silicon concentration at their surfaces, as shown in FIG. 12.

Steps similar to those shown in FIGS. 8F to 8M of Example 1 were then performed to manufacture a MESFET as shown in FIG. 22F.

The drain breakdown voltages of fifty MESFETs manufactured as in Example 5 were measured with measuring equipment similar to that shown in FIG. 4. The measured drain breakdown voltages fell within the range of 40 to 45 V as shown in FIG. 23, thus confirming the high drain breakdown voltages of MESFETs.

EXAMPLE 6

First, as shown in FIG. 24A, an n-type active layer 120 of 0.25 μm thickness was formed on the surface of a GaAs semi-insulating substrate 101 by the epitaxial growth. An SiO$_2$ film 121 of 500 Å thickness was deposited on the active layer 120 by the plasma CVD method. Next, as shown in FIG. 24B, mesa etching was selectively performed from the surface of the SiO$_2$ film 121 to reach the surface of the substrate 101, so as to isolate the active layer 120 in an island form.

Subsequently, as shown in FIG. 24C, a resist pattern 103' having openings corresponding to the prospective source and drain regions was formed by PEP. Using the resist pattern 103' as a mask, an impurity, e.g., silicon, was used for the first ion implantation into active layer 120 and substrate 101 through the SiO$_2$ film 121 at an acceleration energy of 50 keV in a dose of $1.4 \times 10^{13}$ cm$^{-2}$, so as to form silicon ion injection layers 122$_1$ and 122$_2$ for the source and drain regions, in a region extending from the active layer 120 to the surface of the substrate 101. The silicon ion injection layers 122$_1$ and 122$_2$ formed in this step have peak concentration from the first ion implantation at their surfaces, as in the case of FIG. 19.

Figure 24E:
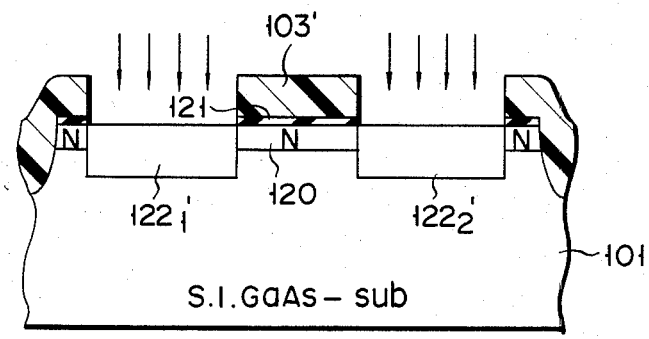

Then, as shown in FIG. 24D, using the resist pattern 103' as a mask, the SiO$_2$ film was selectively etched with dilute hydrofluoric acid to expose the silicon ion injection layers 122$_1$ and 122$_2$. Referring to FIG. 24E, using the resist pattern 103' as a mask, an impurity, e.g., silicon, was used for two second ion implantations at acceleration energies of 120 keV and 250 keV in a dose of $2 \times 10^{13}$ cm$^{-2}$ so as to form high-concentration silicon ion injection layers 122$_1$' and 122$_2$'. The silicon ion injection layers 122$_1$' and 122$_2$' formed in this manner had a silicon concentration distribution as shown in FIG. 11.

Figure 24F:
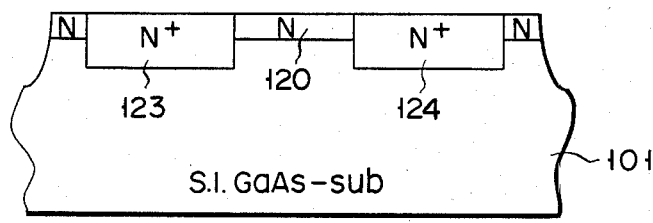

After the resist pattern 103' was removed, annealing was performed at 850° C. for 15 minutes to activate the silicon ion injection layers 122$_1$' and 122$_2$' in the substrate 101, thereby forming n$^+$-type source and drain regions 123 and 124 having a depth of 0.4 μm, as shown in FIG. 24F. The source and drain regions 123 and 124 formed in this step have a peak silicon concentration as in FIG. 12.

Figure 24G:
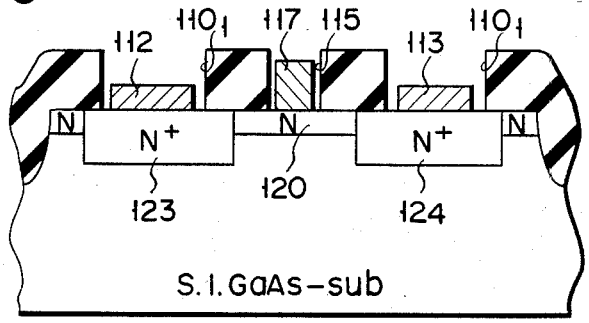

Steps similar to those shown in FIGS. 8F to 8M of Example 1 were performed to complete a MESFET as shown in FIG. 24G.

The drain breakdown voltages of fifty MESFETs manufactured as in Example 6 were measured with measuring equipment similar to that shown in FIG. 4. The measured drain breakdown voltages fell within the range of 40 to 45 V, thus confirming the high drain breakdown voltages of the MESFETs of Example 6.

In Examples 1 to 6 described above, the semi-insulating substrates consisted of GaAs. However, the present invention is not limited to this. Semi-insulating substrates of InP, for example, may alternatively be used.

Furthermore, in Examples 1 to 6 described above, silicon was used as the impurity in ion implantation. However, sulfur, selenium, or the like, may be used instead. These impurities may also be used in combination. For example, silicon can be used in the first ion implantation, and sulfur in the second.

In Examples 1 to 6 described above, the first ion implantation of silicon was performed at an acceleration energy of 50 keV in a dose of $2 \times 10^{13}$ cm$^{-2}$. However, the acceleration energy may be increased up to 150 keV, but the preferable range is 30 to 80 keV.

In Examples 1 to 6 described above, the second ion implantation of silicon was performed twice at acceleration energies of 120 keV and 250 keV in a dose of $2 \times 10^{13}$ cm$^{-2}$. However, the present invention is not limited to this. The number of second ion inplantations is not limited to two but may be performed three or more times, depending on the thickness of the active layer.

In Examples 4 to 6 described above, the SiO$_2$ film formed by the plasma method was used as an insulation film. However, an SiO$_2$ film, an SiN film, an AlN film or the like formed by either the general CVD or sputtering method may also be used.

In summary, according to the present invention, a high breakdown voltage drain region can be formed in a semi-insulating substrate by the ion implantation method, thereby providing a method which is capable of the stable manufacture of highly-reliable MESFETs with a good yield.

What is claimed is:

1. A method of manufacturing a metal semiconductor field-effect transistor (MESFET) by controlling implanted peak surface dopants, comprising the steps of:
   performing a first ion implantation of an impurity into a portion of a semi-insulating substrate made of a compound selected from the group consisting of GaAs and InP, so as to form impurity ion-injection layers therein;
   removing that portion of said impurity ion injection layers which extend from a surface thereof to a depth corresponding to a vicinity of a peak value of an impurity concentration distribution; and
   performing a second ion implantation of the impurity at least once from the surface of said remaining impurity ion injection layers to form high-concentration impurity ion injection layers, and thereafter annealing said layers to activate said high-concentration impurity ion injection layers to form source and drain regions.

2. The method according to claim 1, wherein said impurity is silicon.

3. The method according to claim 1, wherein said impurity is sulphur.

4. The method according to claim 1, wherein said portion of said impurity ion injection layers extends from said impurity ion injection layers to a region in which a ratio of an impurity concentration therein to the peak value is not less than 60%.

5. The method according to claim 1, wherein an impurity ion injection layer to become an active layer is formed on a surface of said semi-insulating substrate.

6. The method according to claim 5, wherein said impurity ion injection layer to become said active layer is formed on the surface of said semi-insulating substrate before the first ion implantation of the impurity.

7. The method according to claim 5, wherein said impurity ion injection layer to become said active layer is formed on the surface of said semi-insulating substrate after the second ion implantation of the impurity and before the annealing.

8. The method according to claim 5, in said step of annealing to form said source and drain regions, said impurity ion injection layer to become said active layer formed on the surface of said semi-insulating substrate is also activated.

9. A method of manufacturing a metal semiconductor field-effect transistor (MESFET) by controlling implanted peak surface dopants, comprising the steps of:
   forming an active layer on a surface of a semi-insulating substrate made of a compound from the group consisting of GaAs and InP;
   performing a first ion implantation of an impurity into a portion of said active layer at least to form impurity ion injection layers;
   removing a portion of said impurity ion injection layers which extends from a surface thereof to a depth corresponding to a vicinity of a peak value of an impurity concentration distribution; and performing a second ion implantation of the impurity from a surface of the remaining impurity ion injection layers to form high-concentration impurity ion injection layers, and thereafter annealing to activate said high-concentration impurity ion injection layers and to form source and drain regions.

10. The method according to claim 9, wherein said active layer is formed on a surface of said semi-insulating substrate by the epitaxial growth.

11. The method according to claim 9, wherein said impurity is silicon.

12. The method according to claim 9, wherein said impurity is sulfur.

13. The method according to claim 9, wherein said portion of said impurity ion injection layers extends from said impurity ion injection layers to a region in which the ratio of an impurity concentration therein to the peak value is not less than 60%.

14. A method of manufacturing a metal semiconductor field-effect transistor (MESFET) by controlling implanted peak surface dopants, comprising the steps of:
  forming an insulation film on a surface of a semi-insulating substrate made of a compound selected from the group consisting of GaAs and InP;
  performing a first ion implantation of an impurity into a portion of said semi-insulating substrate through said insulation film, thus forming impurity ion injection layers the surface region of which has an impurity concentration close to a peak value;
  removing said insulation film; and
  performing a second ion implantation of the impurity at least once from surfaces of said ion injection layers which are exposed, thus forming high-concentration impurity ion injection layers, and thereafter annealing said high-concentration impurity ion injection layers to activate the same and to form source and drain regions.

15. The method according to claim 14, wherein said insulation film comprises a plasma CVD-SiO$_2$ film.

16. The method according to claim 14, wherein said insulation film comprises a plasma CVD-SiN film.

17. The method according to claim 14, wherein said insulation film comprises an AlN film.

18. The method according to claim 14, wherein said impurity is silicon.

19. The method according to claim 14, wherein said impurity is sulfur.

20. The method according to claim 14, wherein the impurity concentration of the surface region of said impurity ion injection layers is not less than 60% of the peak value.

21. The method according to claim 14, wherein an impurity ion injection layer to become an active layer is formed on a surface of said semi-insulating substrate.

22. The method according to claim 21, wherein said impurity ion injection layer to become said active layer is formed on the surface of said semi-insulating substrate before the first impurity ion implantation of the impurity.

23. The method according to claim 21, wherein said impurity ion injection layer to become said active layer is formed on the surface of said semi-insulating substrate after the second impurity ion implantation of the impurity and before the annealing.

24. The method according to claim 21, wherein in said step of annealing to form said source and drain regions, said impurity ion injection layer to become said active layer formed on the surface of said semi-insulating substrate is also activated.

25. A method of manufacturing a metal semiconductor field-effect transistor (MESFET) by controlling implanted peak surface dopants, comprising the steps of:
  forming an active layer on a surface of a semi-insulating substrate made of a compound selected from the group consisting of GaAs and InP;
  forming an insulation film on a surface of said active layer;
  performing a first ion implantation of an impurity into a portion of said semi-insulating substrate through said insulation film, thus forming impurity ion injection layers the surface region of which has an impurity concentration close to a peak value;
  removing said insulation film; and
  performing a second ion implantation of the impurity at least once from surfaces of said impurity ion injection layers which are exposed, thus forming high-concentration impurity ion injection layers, and thereafter annealing said high-concentration impurity ion injection layers to activate the same and to form source and drain regions.

26. The method according to claim 25, wherein said active layer is formed on a surface of said semi-insulating substrate by the epitaxial growth.

27. The method according to claim 25, wherein said insulation film comprises a plasma CVD-SiO$_2$ film.

28. The method according to claim 25, wherein said insulation film comprises a CVD-SiN film.

29. The method according to claim 25, wherein said insulation film comprises an AlN film.

30. The method according to claim 25, wherein said impurity is silicon.

31. The method according to claim 25, wherein said impurity is sulfur.

32. The method according to claim 25, wherein the impurity concentration of the surface region of said impurity ion injection layers is not less than 60% of the peak value.

* * * * *